United States Patent [19]
Ogawa et al.

[11] Patent Number: 6,028,390
[45] Date of Patent: Feb. 22, 2000

[54] PIEZOELECTRIC RESONATOR AND ELECTRONIC COMPONENT INCLUDING SAME

[75] Inventors: Mamoru Ogawa, Moriyama; Toshio Nishimura, Shiga-ken; Toshiyuki Baba, Moriyama; Jiro Inoue, Omihachiman; Shigemasa Kusabiraki, Takaoka; Tetsuo Takeshima, Toyama; Takeshi Yamazaki, Ishikawa-ken, all of Japan

[73] Assignee: Murata Manufacturing Co., Ltd., Japan

[21] Appl. No.: 09/065,998

[22] Filed: Apr. 24, 1998

[30] Foreign Application Priority Data

Apr. 25, 1997 [JP] Japan .................................. 9-123277
Oct. 3, 1997 [JP] Japan .................................. 9-287669

[51] Int. Cl.$^7$ ................................................ H01L 41/053
[52] U.S. Cl. .............................................................. 310/348
[58] Field of Search ...................................... 310/320, 321, 310/348, 365, 312

[56] References Cited

U.S. PATENT DOCUMENTS

| | | | |
|---|---|---|---|
| 3,846,650 | 11/1974 | Barrow | 310/321 |
| 3,979,565 | 9/1976 | McShane | 310/321 |
| 4,666,547 | 5/1987 | Snowden et al. | 310/321 |
| 4,939,403 | 7/1990 | Toshihiko et al. | 310/320 |
| 5,359,494 | 10/1994 | Morimoto | 310/313 R |
| 5,406,682 | 4/1995 | Zimnicki et al. | 310/364 |
| 5,801,474 | 9/1998 | Sakairi | 310/313 R |
| 5,825,262 | 10/1998 | Inoue et al. | 310/328 |

FOREIGN PATENT DOCUMENTS 2746985  3/1997  France ............................. H03H 9/17

*Primary Examiner*—Thomas M. Dougherty
*Attorney, Agent, or Firm*—Graham & James LLP

[57] ABSTRACT

A piezoelectric resonator includes a piezoelectric resonator element vibrating in a longitudinal vibration mode and having a mounting surface, wherein a resin material is provided on the mounting surface of the piezoelectric resonator element, and the resin material has a hardness of about 0 to about 50 in units defined in the JIS-A standards and/or an elastic modulus of about 0.1 to 10 MPa.

19 Claims, 23 Drawing Sheets

PIEZOELECTRIC RESONATOR AND ELECTRONIC COMPONENT INCLUDING SAME

BACKGROUND OF THE INVENTION

1. Field of the Invention

The present invention relates to a piezoelectric resonator and an electronic component including such a piezoelectric resonator, and more particularly to a piezoelectric resonator including a piezoelectric resonator element vibrating in a longitudinal vibration mode, and an electronic component, such as an oscillator, a discriminator, and a filter, including such a piezoelectric resonator.

2. Description of Related Art

FIG. 34 is a perspective view showing an example of a conventional piezoelectric resonator. The piezoelectric resonator 1 includes a rectangular-shaped piezoelectric body 2, and electrodes 3a and 3b disposed on two opposite side surfaces of the piezoelectric body 2. The piezoelectric body 2 disposed between the two electrodes 3a and 3b is polarized in a direction that is perpendicular to the major surfaces of the electrodes 3a and 3b as shown by an arrow in FIG. 34. In this piezoelectric resonator 1, longitudinal vibrations are generated when an excitation signal is applied between the two electrodes 3a and 3b.

An example of an electronic component incorporating this piezoelectric resonator 1 is shown in FIG. 35. This electronic component 4 includes a substrate 5 made of an insulating material. Lead electrodes 6a and 6b are disposed on the substrate 5. A supporting member 7 made of, for example, a conductive material, is located on one lead electrode 6a. The supporting member 7 is made of, for example, an epoxy-based conductive resin having a hardness of greater than 50 units defined in the JIS-A standards and having an elastic modulus of greater than 10 MPa. The piezoelectric resonator 1 is fixed to the upper surface of the supporting member 7. One electrode 3a is connected to the supporting member 7 and the other electrode 3b is connected to a pattern electrode 6b via a lead wire 8.

The electronic component 4 constructed in the above-described manner is used for example as a resonator, in which longitudinal vibration is generated in the piezoelectric resonator 1 when an excitation signal is applied between the electrodes 3a and 3b. The generation of longitudinal vibration in response to the applied signal makes it possible to use the electronic component device 1 as a resonator or a discriminator.

In the above-described structure in which the piezoelectric resonator is supported by the supporting member, the supporting member causes leakage of vibration from the piezoelectric resonator, and the leakage of vibration can generate an anomaly such as a ripple in the electronic characteristics of the component. Furthermore, the supporting member must have a precisely uniform and completely even surface so that the piezoelectric resonator can be accurately and evenly mounted thereon. If the supporting member has an uneven or angled surface, the piezoelectric resonator undesirably contacts the substrate thus interfering with the vibration of the resonator. To avoid such interference with the vibration of the resonator, it is required that the piezoelectric resonator should be mounted on the substrate in a firm and stable manner, for example, by bonding both ends of the piezoelectric resonator to the substrate via an adhesive such as resin. However, if the piezoelectric resonator is bonded to the supporting member, the adhesive for bonding and the supporting member act as a load to the vibration. This means that when the piezoelectric resonator is bonded to the supporting member, a change occurs in the resonator characteristics such as the mechanical quality factor Qm or the resonance frequency of the resonator. To compensate for the change in resonator characteristics caused by the adhesive and the supporting member, an adjustment to the resonator must be made after mounting the piezoelectric resonator on the substrate.

In the conventional mounting technique, as described above, the piezoelectric resonator has to be mounted so that it is supported in a completely even and stable fashion and the resonator characteristics have to be adjusted after the mounting step has been completed. Thus, the conventional mounting and assembly technique requires complicated processes and highly precise mounting accuracy and additional corrective steps after mounting.

SUMMARY OF THE INVENTION

To overcome the problems described above, preferred embodiments of the present invention provide a piezoelectric resonator which can be easily mounted on a substrate while avoiding changes in the resonator characteristics, and also provide a small-sized electronic component which is easily manufactured and has reliable electrical characteristics which do not change during or after a mounting and assembly process.

The preferred embodiments of the present invention provide a piezoelectric resonator including a piezoelectric resonator element having a mounting surface and a resin material provided on the mounting surface of the piezoelectric resonator element, wherein the resin material has a hardness of about 0 to about 50 in units defined in the JIS-A standards and/or has an elastic modulus of about 0.1 to about 10 MPa.

The above characteristics of the resin material are selected based on the discovery that such resin material does not cause a change in the resonator characteristics when the resin material is added to a resonator. As a result, the resin material can be added to the resonator and the resonator can be mounted on a substrate easily and without having to adjust the characteristics of the resonator after mounting of the resonator on the substrate.

Also, it is preferred that the resin material is located at substantially a central portion along a length of the piezoelectric resonator element.

Preferably, the piezoelectric resonator element according to preferred embodiments of the present invention includes a pair of external electrodes and a pair of electrically conductive resin material elements connected to the pair of external electrodes, respectively at the approximate central portion along the length of the piezoelectric resonator element.

In the piezoelectric resonator according to preferred embodiments of the present invention, each of the pair of external electrodes have a substantially planar shape, and the piezoelectric resonator element may include the pair of external electrodes and a piezoelectric body disposed between the external electrodes, and the piezoelectric body may be polarized in a direction which is substantially perpendicular to a plane in which the external electrodes are located.

In the piezoelectric resonator according to preferred embodiments of the present invention, the piezoelectric resonator element may include a main body having a length and including at least two planar shaped internal electrodes arranged to be substantially perpendicular to the length of the main body and a piezoelectric body disposed between the internal electrodes. The piezoelectric body may be polarized in a direction along the length of the main body. The pair of internal electrodes are preferably connected to the pair of external electrodes, respectively.

In at least one preferred embodiment of the present invention, a thermal expansion coefficient of the resin material is preferably substantially equal to that of the electrically conductive resin material elements.

The piezoelectric resonator element may include a main body having a length and at least two substantially planar shaped electrodes arranged to be substantially perpendicular to the length of the main body and a piezoelectric body disposed between the substantially planar shaped electrodes. The piezoelectric body may be polarized in a direction along the length of the main body, and the pair of substantially planar shaped electrodes may be connected to the pair of external electrodes, respectively.

Another preferred embodiment of the present invention provides an electronic component including at least one piezoelectric resonator described in the preceding paragraphs according to other preferred embodiments of the present invention, wherein the piezoelectric resonator is mounted on a substrate via the resin material. In this preferred embodiment, the external electrodes are preferably connected via the electrically conductive resin materials to lead electrodes provided on the substrate.

Also, in this electronic component, the electrically conductive resin material elements of the piezoelectric resonator are preferably connected to the lead electrodes via an electrically conductive adhesive. Furthermore, the electrically conductive resin material elements may be fixed via an electrically conductive adhesive to the lead electrodes, respectively.

In the above described electronic component according to a preferred embodiment of the present invention, a plurality of piezoelectric resonators may be disposed on the substrate and connected in such a manner so as to define a ladder filter.

In the piezoelectric resonator according to preferred embodiments of the present invention having the resin material disposed on the mounting surface of the piezoelectric resonator element utilizing longitudinal vibration mode, the resin material and the characteristics thereof are selected to prevent any change in the characteristics of the resonator when the resin material is disposed thereon to avoid the need to adjust the resonator characteristics after mounting of the resonator.

When the piezoelectric vibrator according to preferred embodiments of the present invention vibrates in a longitudinal vibration mode, a vibration node where no vibration occurs is located at the approximate central portion of the piezoelectric resonator element. Therefore, it is preferable that the piezoelectric resonator be mounted on the substrate so that the piezoelectric resonator having the resin material disposed thereon before mounting is supported at the approximate central portion corresponding to the location of the vibration node.

Furthermore, electronically conductive resin material elements may be formed in such a manner that the resin material elements are connected, at locations near the vibration node, to the external electrodes of the piezoelectric resonator element. In this arrangement, the piezoelectric resonator element is preferably mounted on the substrate in such a manner that the external electrodes are electrically connected via the electrically conductive resin material elements to the lead electrodes disposed on the substrate.

The piezoelectric resonator element may be mounted on the substrate only via the electrically conductive resin material elements connected to the external electrodes. Also in this arrangement, the resonator achieves the desired characteristics even after mounting and the resonator characteristics are not affected by the addition of the resin material. When the piezoelectric resonator element according to the arrangement of this preferred embodiment is mounted on the substrate, the external electrodes can be electrically connected to the lead electrodes located on the substrate via the electrically conductive resin material elements.

The piezoelectric resonator element may be constructed either such that the electrodes are located on two side surfaces of the piezoelectric body or to have a main body including a plurality of piezoelectric bodies and electrodes disposed in a multilayer arrangement.

In the arrangement of the preferred embodiment in which both resin material and electrically conductive resin material elements are disposed on the piezoelectric resonator element, it is preferable that the resin material and the electrically conductive resin material elements have a similar or substantially the same thermal expansion coefficient so that the electrically conductive resin material elements do not peel off even if the piezoelectric resonator is used in an environment where ambient temperature varies.

In the electronic component constructed using the piezoelectric resonator mounted on the substrate according to preferred embodiments of the present invention, if a resin material has a rather low hardness and/or small elastic modulus, then a rather small mechanical coupling between the piezoelectric resonator and the substrate can be achieved thereby ensuring that no significant vibration leakage occurs from the piezoelectric resonator element to the substrate. Furthermore, because the resin material is disposed on the resonator in advance and is taken into consideration before the resonator is mounted and because the resin material has the carefully selected characteristics which do not change resonator characteristics, the piezoelectric resonator encounters no significant change in the resonator characteristics when it is mounted. Furthermore, electric connections between the piezoelectric resonator and the lead electrodes formed on the substrate can be achieved via the electrically conductive adhesive without having to use lead wires which are used in conventional electronic components.

Other features and advantages of the present invention will become apparent from the following description of preferred embodiments of the present invention which refers to the accompanying drawings.

DETAILED DESCRIPTION OF PREFERRED EMBODIMENTS

Figure 1:
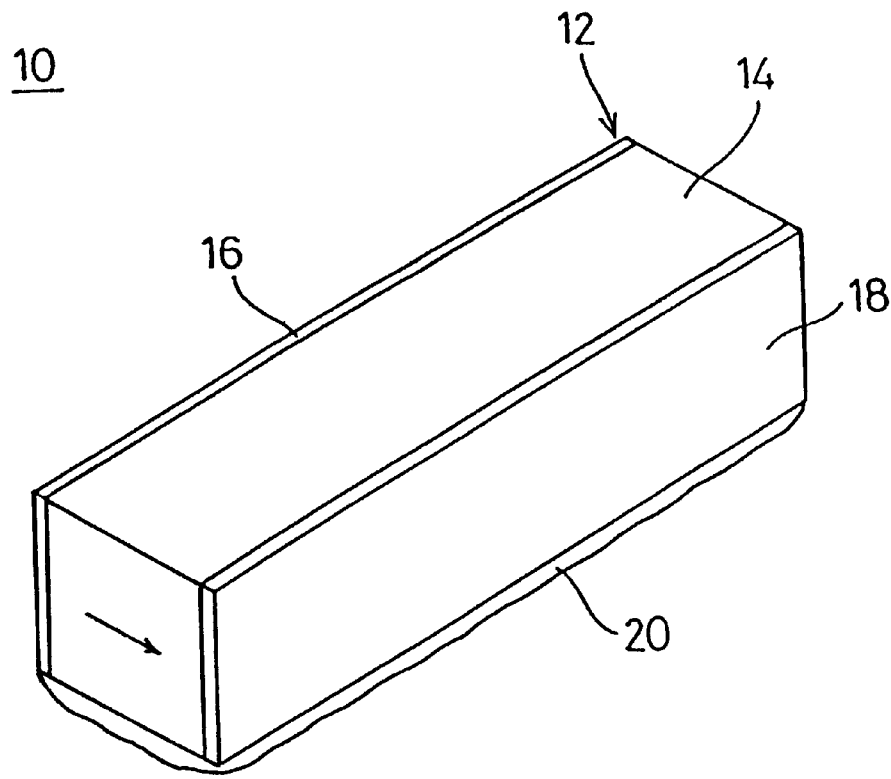
FIG. 1 is a perspective view illustrating a preferred embodiment of a piezoelectric resonator according to the present invention.
Figure 2:
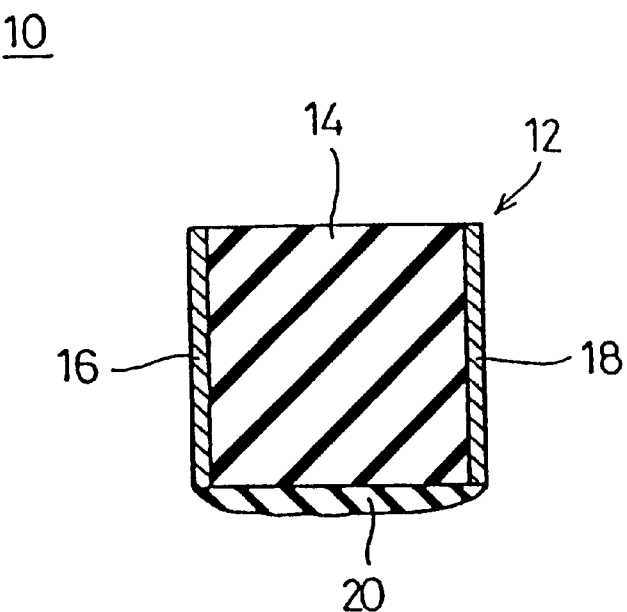
FIG. 2 is a cross-sectional view of the piezoelectric resonator shown in FIG. 1.

FIG. 1 is a perspective view illustrating a preferred embodiment of the present invention, and FIG. 2 is a cross-sectional view thereof. As shown, a piezoelectric resonator 10 includes a piezoelectric resonator element 12. The piezoelectric resonator element 12 preferably includes a substantially rectangular-shaped piezoelectric body 14 and external electrodes 16 and 18. The piezoelectric body 14 is preferably polarized in a direction perpendicular to the major surfaces of the external electrodes 16 and 18 as shown by an arrow of FIG. 1. One side surface of the piezoelectric resonator element 12, on which no external electrodes 16 and 18 are located, is preferably covered with a resin material 20. Preferable materials for the resin material 20 include, for example, silicone resins, urethane resins, and epoxy resins, having a JIS-A hardness of about 0 to about 50. In this preferred embodiment, a urethane resin having a JIS-A hardness of about 0 and having an elastic modulus of about 0.1 to about 10 MPa is preferably used as the resin material 20. The thickness of the resin material 10 is preferably about 50 $\mu$m to about 100 $\mu$m.

In this piezoelectric resonator 10, if a signal is applied between the external electrodes 16 and 18, longitudinal vibration is generated in the piezoelectric resonator element 12.

In this piezoelectric resonator 10 having the structure including the resin material 20 as described above, the resin material 20 affects the longitudinal vibration of the piezoelectric resonator element 12, and thus, the presence of the resin material 20 results in changes in the resonator characteristics, such as mechanical quality factor Qm and resonance frequency, as compared to the resonator characteristics obtained when the resin material 20 is not provided on the piezoelectric resonator element 12. However, when the piezoelectric resonator 10 is mounted on the substrate in such a manner that the resin material 20 is in contact with the substrate via an adhesive or a double-sided adhesive tape, the adhesive or the tape does not affect the vibration and thus, no further change occurs in the resonator characteristics. The characteristics of the piezoelectric resonator element 12 are mainly determined by a length thereof. The longitudinal vibration of the piezoelectric resonator element 12 is substantially affected by the hardness or the elastic modulus of the resin material 20. Therefore, if the dimensions of the piezoelectric resonator element 12 and the hardness and the elastic modulus of the resin material 20 are determined properly, then it is possible to make the piezoelectric resonator 10 have desired resonator characteristics. Furthermore, by taking such factors into consideration and disposing the resin material 20 and adhesive on the resonator before the resonator is mounted and because the resin material is carefully selected to have characteristics which do not affect the resonator characteristics, there is no change in the characteristics of the resonator after mounting of the resonator on a substrate.

In a specific example of a preferred embodiment of the present invention, the substrate on which the piezoelectric resonator 10 is mounted preferably includes a glass epoxy substrate, an aluminum substrate, a multilayer substrate, and a dielectric substrate.

Figure 3:
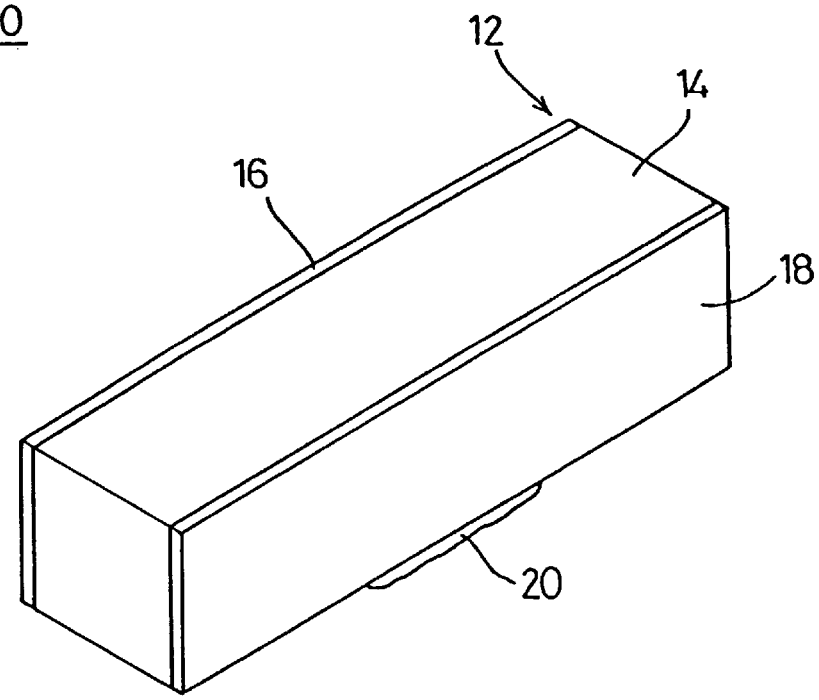
FIG. 3 is a perspective view illustrating an example of a piezoelectric resonator which is a modification of the resonator shown in FIG. 1.
Figure 4:
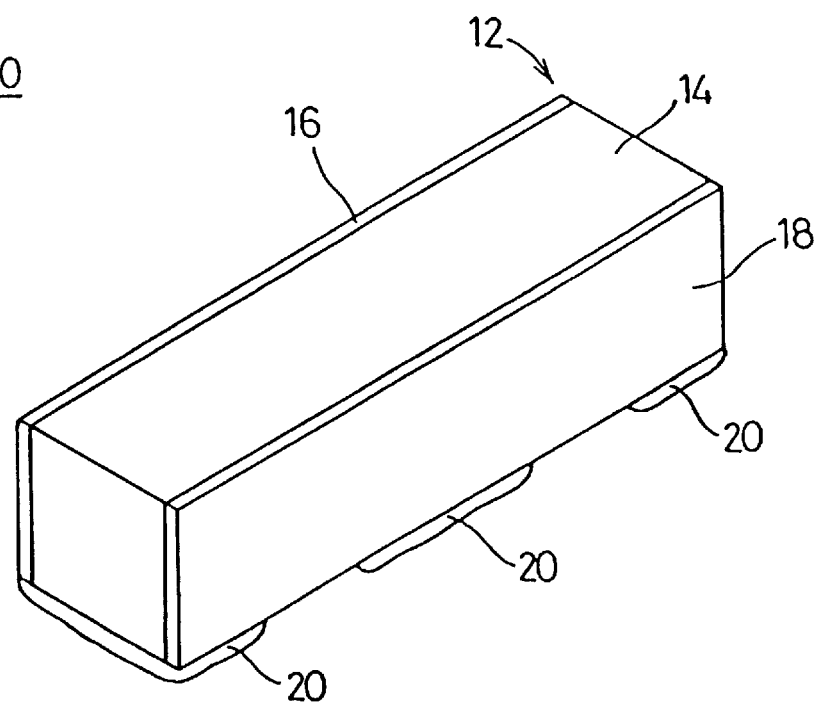
FIG. 4 is a perspective view illustrating another example of a piezoelectric resonator which is another modification of the resonator shown in FIG. 1.

When the resin material 20 is disposed on the side surface of the piezoelectric resonator element 12 on which no external electrode is located, it is not necessarily required that the resin material 20 be disposed over an entire surface thereof. The resin material 20 may also be arranged, as shown in FIG. 3, in such a manner that the resin material is present only in a partial area, near an approximate central portion along a length of the side surface of the piezoelectric resonator element 12, or otherwise in both end areas in addition to the approximate central area of the side surface of the piezoelectric resonator element 12 as shown in FIG. 4. Although the resin material 20 may be arranged in various locations and configurations as described above, it is more preferable that the resin material 20 be provided at the approximate central portion of the mounting surface of the piezoelectric resonator element 12, for the following reason. When longitudinal vibration occurs in the piezoelectric resonator 10, a vibration node is present at the approximate central portion of the piezoelectric resonator element 12. Therefore, it is preferable that the piezoelectric resonator 10 be mounted on the substrate so that the piezoelectric resonator 10 is supported at the approximate central portion thereof where the node of vibration is located.

Figure 5:
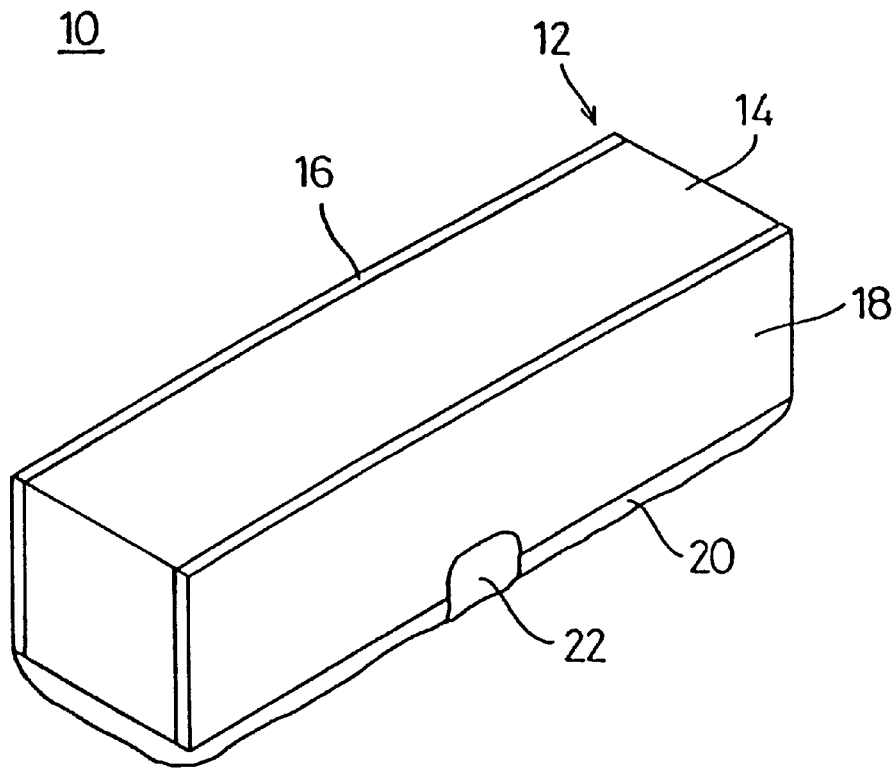
FIG. 5 is a perspective view illustrating another preferred embodiment of a piezoelectric resonator according to the present invention.
Figure 6:
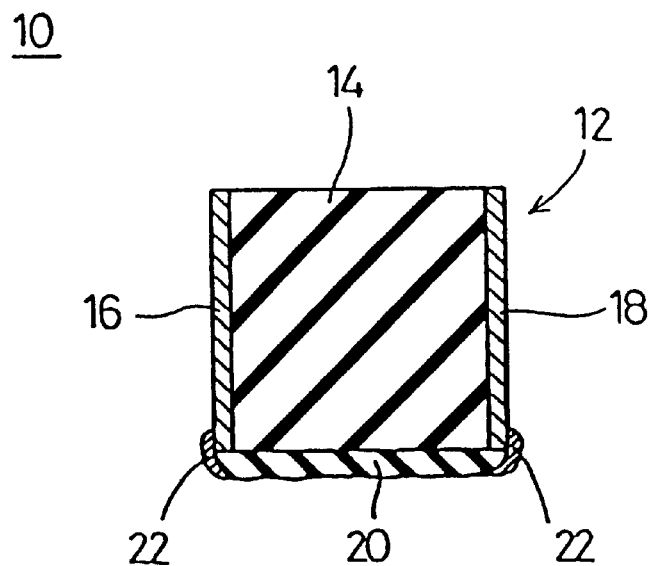
FIG. 6 is a cross-sectional view of the piezoelectric resonator shown in FIG. 5.
Figure 7:
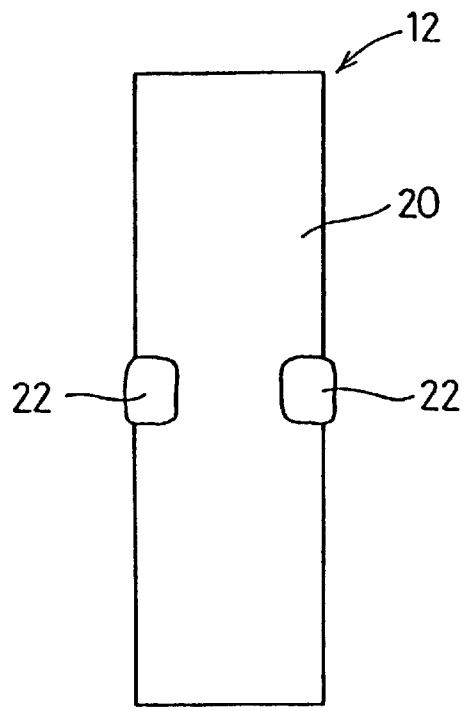
FIG. 7 is a plan view illustrating an example of the locations at which the electrically conductive materials are located on the piezoelectric resonator shown in FIG. 5.
Figure 8:
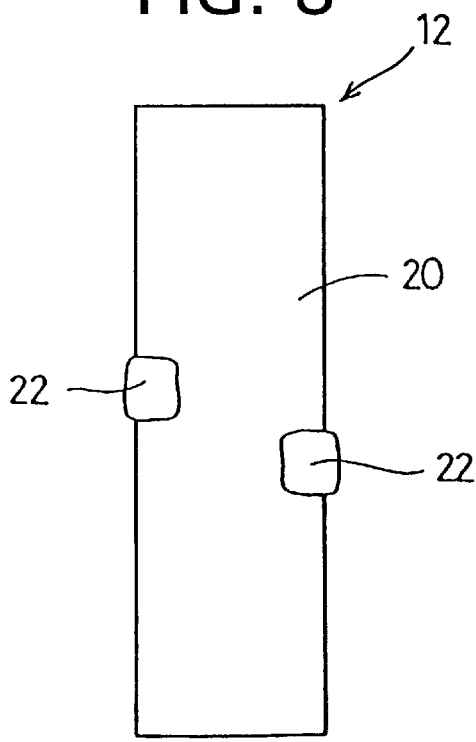
FIG. 8 is a plan view illustrating another example of the locations at which the electrically conductive materials are located on the piezoelectric resonator shown in FIG. 5.
Figure 9:
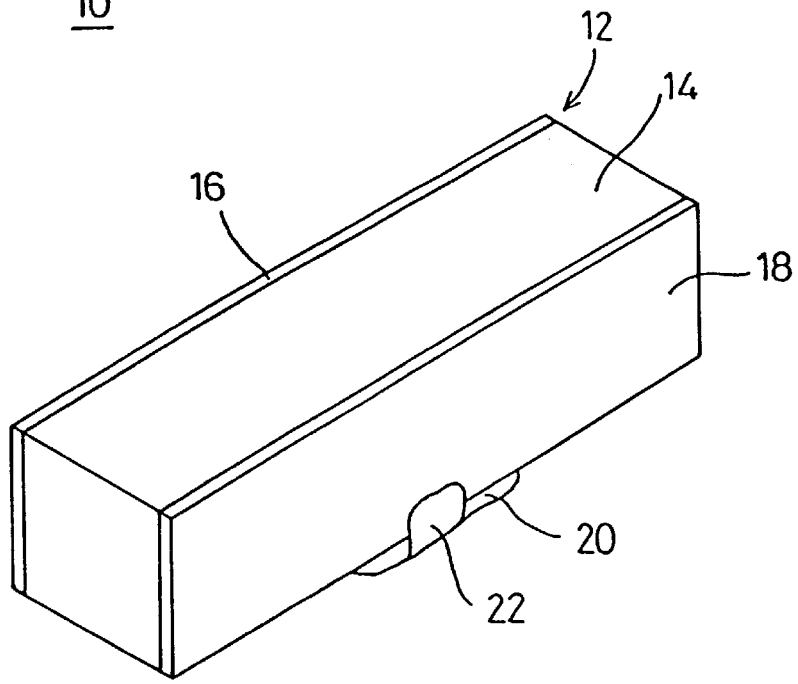
FIG. 9 is a perspective view illustrating an example of a piezoelectric resonator which is a further modification of the resonator shown in FIG. 5.
Figure 10:
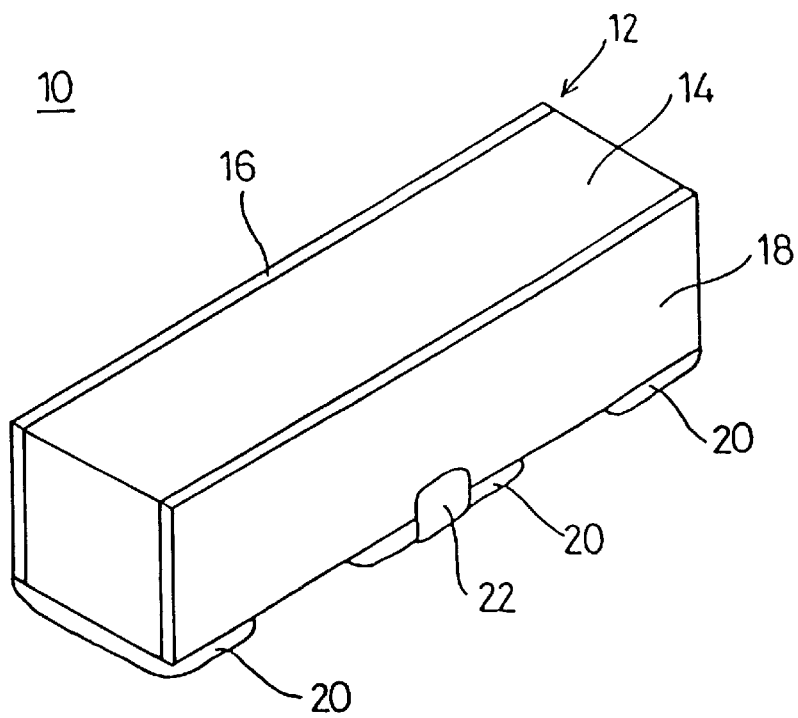
FIG. 10 is a perspective view illustrating another example of a piezoelectric resonator which is another modification of the resonator shown in FIG. 5.

The piezoelectric resonator 10 may further have, as shown in FIGS. 5 and 6, a pair of electrically conductive resin material elements 22 disposed on both side surfaces, at the edges of a widthwise direction and near the approximate central portion along a length of the piezoelectric resonator element 12. The electrically conductive resin material elements 22 are arranged in such a manner that they slightly extend from the end portions of the external electrodes 16 and 18 onto the surface on which the resin material 20 is located. In this case, the electrically conductive resin material elements 22 may be both located at the approximate central portion along the length of the piezoelectric resonator element 12 as shown in FIG. 7, or in a manner such that they are located at positions shifted from the approximate central portion along the length thereof as shown in FIG. 8. In the case of the piezoelectric resonator 10 having the resin material 20 located only at the approximate central portion of the piezoelectric resonator element 12, or in the case of the piezoelectric resonator 10 having the resin materials 20 located on both end portions in addition to the approximate central portion of the piezoelectric resonator element 12, electrically conductive resin material elements 22 may also be formed as shown in FIG. 9 or 10.

It is preferable that the resin material 20 and the electrically conductive resin material elements 22 have a similar or substantially the same thermal expansion coefficient so that the electrically conductive resin material elements 22 do not peel off the resin material 20 even when used in an environment in which ambient temperature changes. For example, when a silicone resin is used as the resin material 20, a material containing a silicone resin may be used as the electrically conductive resin material elements 22. If a urethane resin is used as the resin material 20, a material containing a urethane resin may be used for the electrically conductive resin material elements 22.

Figure 11:
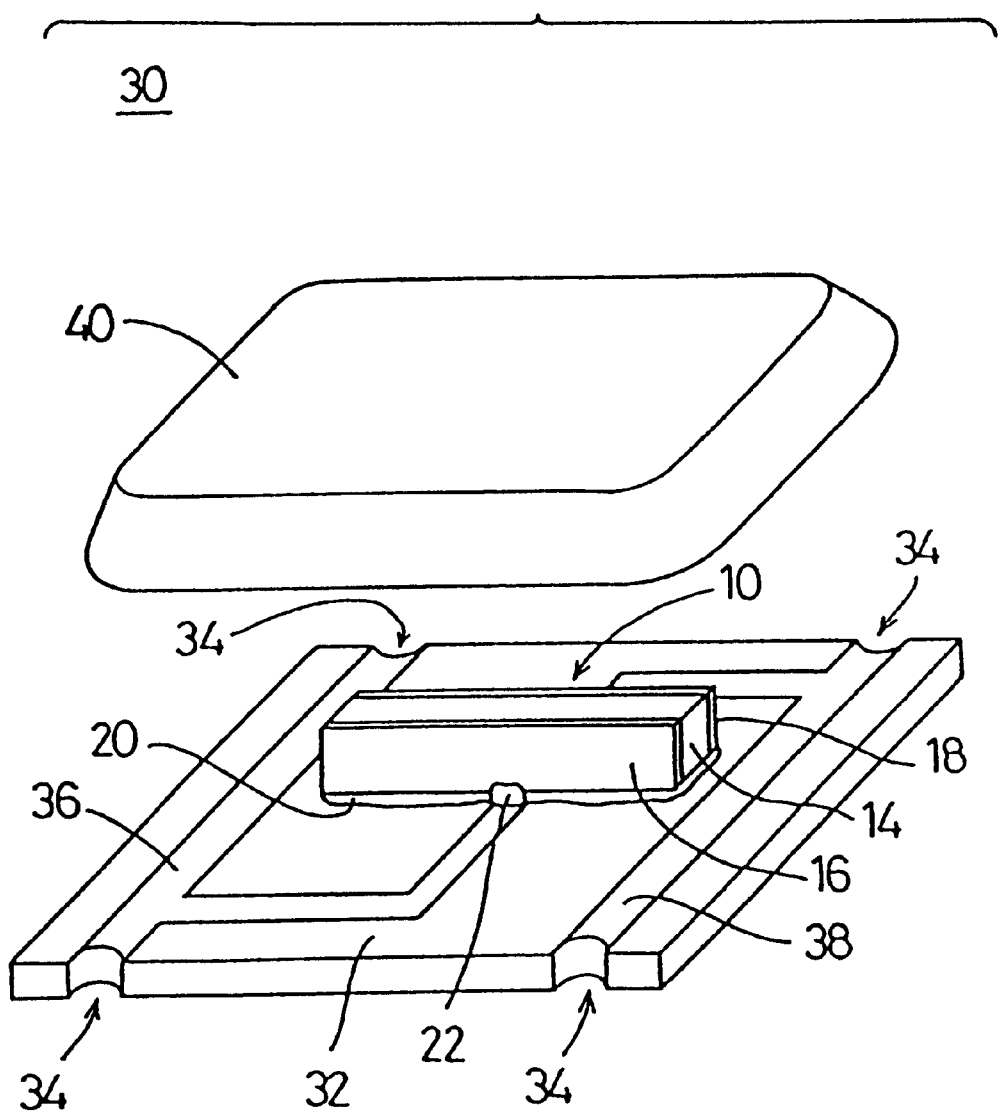
FIG. 11 is a perspective view illustrating a preferred embodiment of an electronic component using the piezoelectric resonator shown in FIG. 5.

The piezoelectric resonator 10 can be used to produce an electronic component such as a resonator and a discriminator. FIG. 11 illustrates an example of a preferred embodiment of such an electronic component. In this specific example, the electronic component 30 includes a substrate 32 made of an insulating material such as alumina. For example, two notches 34 may be formed in each of opposite ends of the substrate 32. Two lead electrodes 36 and 38 are preferably disposed on the upper surface of the substrate 32. One lead electrode 36 is preferably disposed between the opposite notches 34 in such a manner that the electrode 36 extends from one end into an L shape toward the approximate central portion of the substrate 32. The other lead electrode 38 is disposed between the other pair of opposite notches 34 in such a manner that the electrode 38 extends from one end into an L shape toward the approximate central portion of the substrate 32.

The piezoelectric resonator 10 is mounted on the substrate 32 in such a manner that the surface on which the resin material 20 is located is in contact with the substrate 32. In this preferred arrangement, the end, at the approximate central portion of the substrate 32, of the lead electrode 36 and that of the lead electrode 38 are connected via an electrically conductive adhesive or the like to the respective electrically conductive resin material elements 22 of the piezoelectric resonator 10. Furthermore, at least a part of the piezoelectric resonator 10 is connected to the substrate 32 in such a manner that the substrate 32 and the resin material 20 of the piezoelectric resonator 10 are bonded to each other via an electrically insulating adhesive, and the electrically conductive resin material elements 22 are bonded to the lead electrodes 36 and 38 so that the external electrodes 16 and 18 are electrically connected to the lead electrodes 36 and 38. The substrate 32 is then covered with a metal cap 40. To prevent the metal cap 40 from coming into electrical contact with the lead electrode 36 and 38, the substrate 32 and the lead electrodes 36 and 38 are preferably coated with an electrically insulating resin (not shown). When the substrate 32 is covered with the metal cap 40, the process of producing the electronic component 30 is complete. In this electronic component 30, the lead electrodes 36 and 38 extending onto the back surface of the substrate 32 via the notches 34 are used as input/output terminals for achieving connections to an external circuit.

Figure 32:
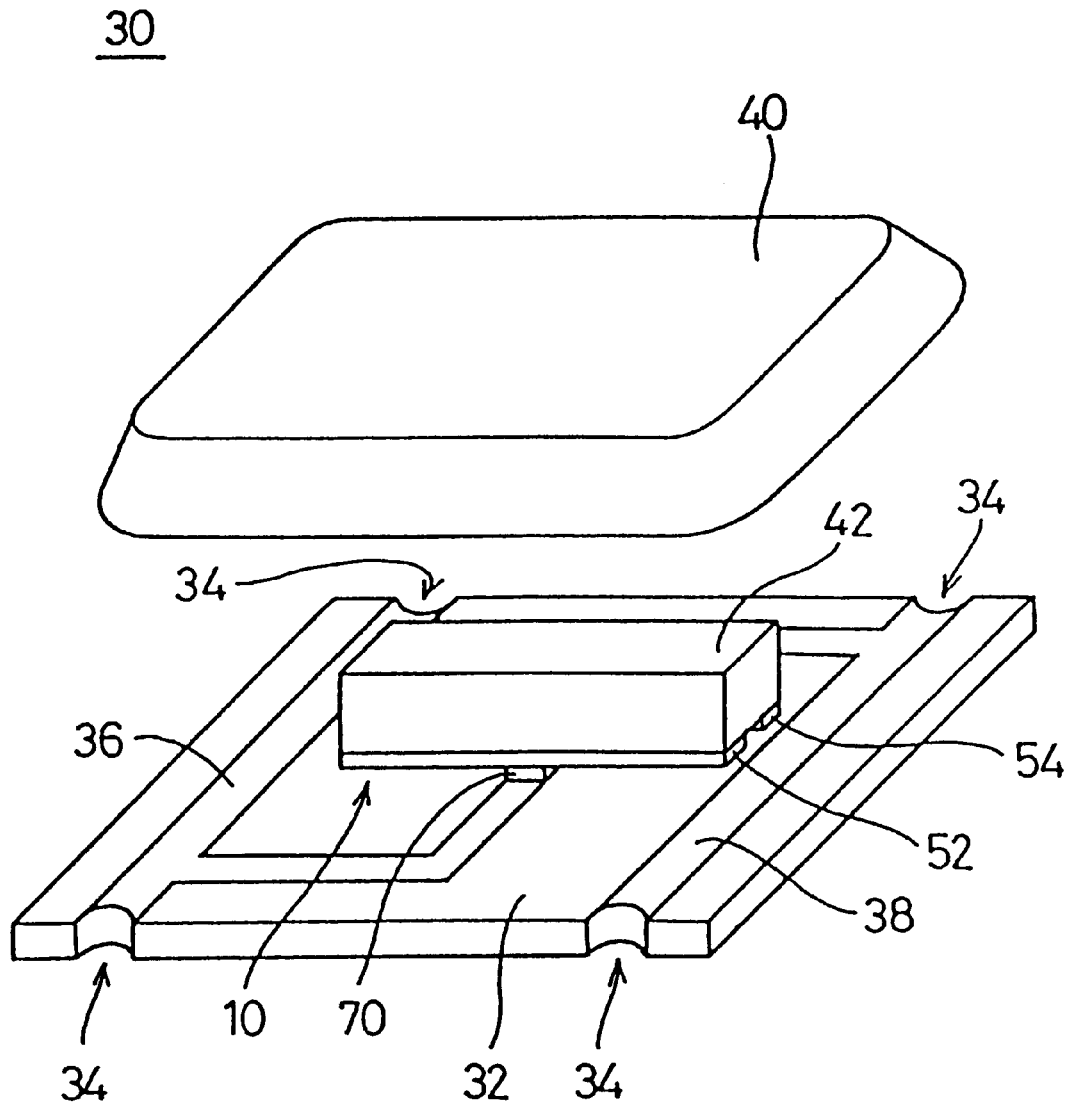
FIG. 32 is an exploded perspective view illustrating a preferred embodiment of an electronic component including a piezoelectric resonator having supporting members.

In this electronic component 30, when a signal is applied across the piezoelectric resonator element 12 via the lead electrodes 36 and 38 and further via the electrically conductive resin material elements 22, longitudinal vibration occurs in a fundamental mode in which a vibration node is defined at the approximate central portion of the piezoelectric resonator element 12. In this electronic component 30, a soft material having a hardness of about 0 to about 50 in units defined in the JIS-A standards is preferably used as the resin material 20. As a result, unlike conventional electronic component devices, it is not necessary that the supporting member with a large hardness have a large thickness to prevent leakage of vibration. Therefore, it is possible to reduce the distance between the piezoelectric resonator element 12 and the substrate 32. In this structure of this preferred embodiment, in spite of the small thickness of the resin material 20 via which the piezoelectric resonator 10 is mounted, the presence of the resin material 20 prevents the vibration from leaking to the substrate 32 from the piezoelectric resonator 10 thereby preventing ripples from occurring. Furthermore, the supporting member 7 having a large thickness such as that shown in FIG. 32 is not needed in preferred embodiments of the present invention, and thus, it is possible to achieve an electronic component device having a significantly reduced thickness.

Furthermore in the electronic component 30 having an electrically insulating resin formed either in the manner shown in FIG. 5 or in the manner shown in FIG. 10, unlike the case of electronic components using a conventional supporting member in which special care and great accuracy is required so that the supporting member has a highly precisely even and smoothly uniform surface, the piezoelectric resonator 10 can be easily mounted using the resin material 20 in a desirable fashion without causing the piezoelectric resonator element 12 to come into contact with the substrate 32 and without requiring the special care and great accuracy required in the prior art. Furthermore, because the characteristics of the piezoelectric resonator 10 are substantially determined when the resin material 20 is formed in advance, no significant changes occur in the characteristics of the piezoelectric resonator 10 when the piezoelectric resonator 10 is mounted on the substrate 32. Therefore, no adjustment of the resonator characteristics is required after mounting the piezoelectric resonator 10. Thus, neither a special highly precisely smooth and even surface nor adjustment of resonator characteristics is required with preferred embodiments of the present invention. As a result, the electronic component 30 is easily produced at a much lower cost.

Figure 12:
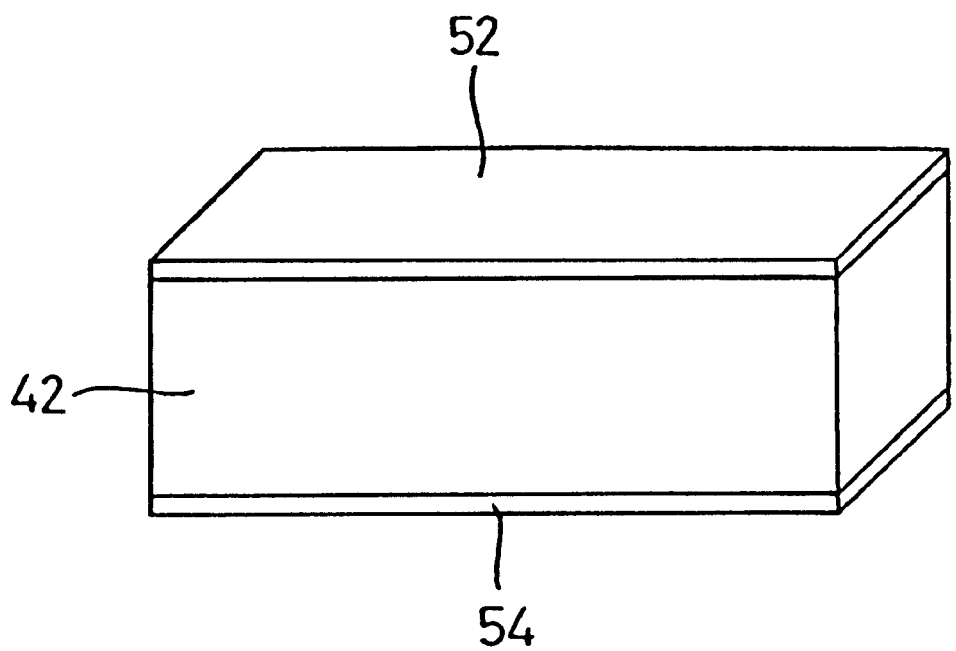
FIG. 12 is a perspective view illustrating another example of a piezoelectric resonator element for use in the piezoelectric resonator according to preferred embodiments of the invention.
Figure 13:
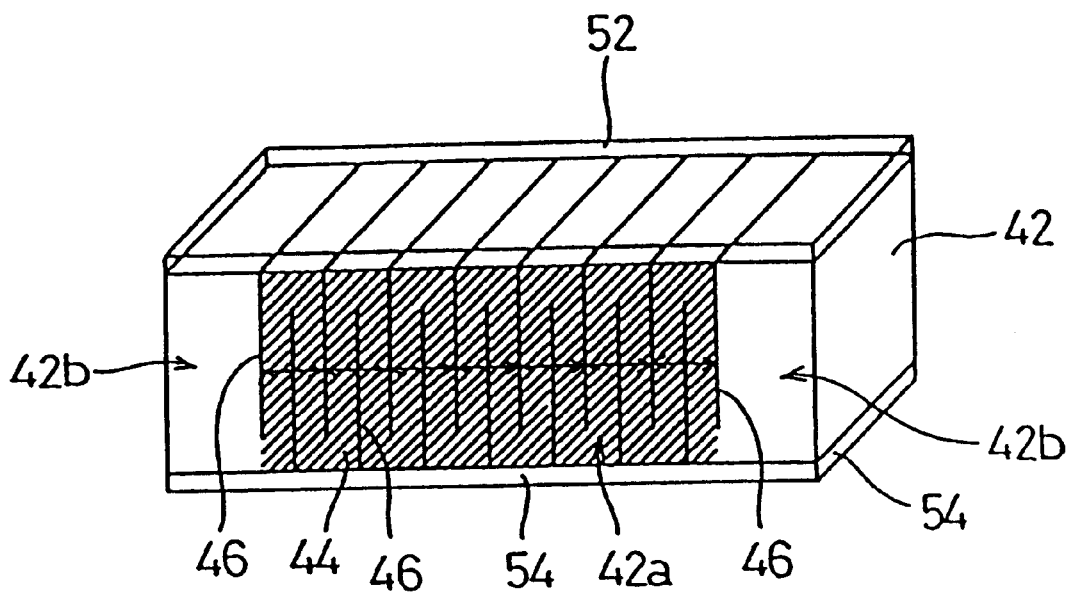
FIG. 13 is a schematic diagram illustrating the structure of the piezoelectric resonator element shown in FIG. 12.
Figure 14A:
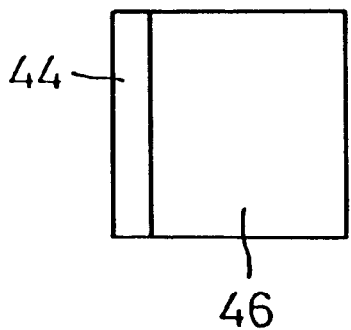
FIGS. 14(a) and 14(b) are schematic diagrams illustrating the relationship between the piezoelectric bodies and the internal electrodes used in the piezoelectric resonator element shown in FIG. 12.
Figure 14B:
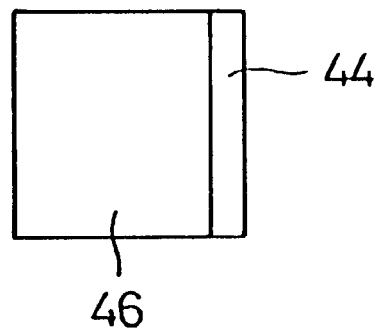

The piezoelectric resonator element 12 may also have a multilayer structure as shown in FIG. 12 or FIG. 13. In this example, the piezoelectric resonator element 12 preferably includes a substantially rectangular-shaped main body 42. The main body 42 is constructed by alternately disposing a plurality of piezoelectric bodies 44 and internal electrodes 46. In this structure, the piezoelectric bodies 44 and the internal electrodes 46 are all disposed so that the planes in which they are located are substantially perpendicular to the longitudinal direction of the main body 42. One group of internal electrodes 46 are disposed, for example, on a piezoelectric body 44 in such a manner that the surface of the piezoelectric body 44 is covered except for a first end portion thereof by the internal electrode 46 as shown in FIG. 14a. A second group of internal electrodes 46 are located on a piezoelectric body 44 in such a manner that the surface of the piezoelectric body 44 is covered except for a second end portion thereof which is opposite to the first portion, by the internal electrode 46. The internal electrodes 46 are disposed in such a manner that the two different groups of internal electrodes are alternately located in the multilayer structure, and in a manner such that ends of the adjacent internal electrodes 46 are exposed alternately at the opposite sides of the main body 42.

The piezoelectric bodies 44 are preferably polarized in a longitudinal direction of the main body 42 such that any two piezoelectric bodies disposed on opposite sides of each internal electrode 46 are polarized in opposite directions as shown by arrows in FIG. 13. In this structure, however, both end portions 42b of the main body 42 are preferably not polarized. The two side surfaces of the main body 42, at which the internal electrodes 46 are alternately exposed, are preferably covered with external electrodes 52 and 54, respectively, so that one external electrode 52 is connected to the first group of internal electrodes 46 and the other external electrode 54 is connected to the second group of internal electrodes 46 adjacent to the electrodes of the first group.

In this piezoelectric resonator 10, the external electrodes 52 and 54 are used as input/output electrodes. When an electric field is generated between the respective adjacent internal electrodes 46 except for both end portions, the main body 42 is excited into a piezoelectrically active state. However, because no electrodes are disposed on both end surfaces of the main body 42, no electric field is developed in either of the end portions of the main body 42. Thus, the main body 42 is not polarized at the end portions such that the end portions remain in a piezoelectrically inactive state. In other words, when an input signal is applied, an active region 42a is defined in the central portion of the main body 42 as shown by the diagonally shaded region in FIG. 13, while inactive regions 42b are created in both end portions of the main body 42. In these inactive regions 42b, no driving force is generated when the input signal is applied. The inactive regions may also be created if no polarization occurs between internal electrodes when an electric field is developed between the internal electrodes. Otherwise, the inactive regions may be provided in a structure in which no electric field is developed across piezoelectric body layers which are polarized. In the present invention, the inactive regions 42b are not necessarily needed, and the entire portion of the main body may be an active region.

Figure 15:
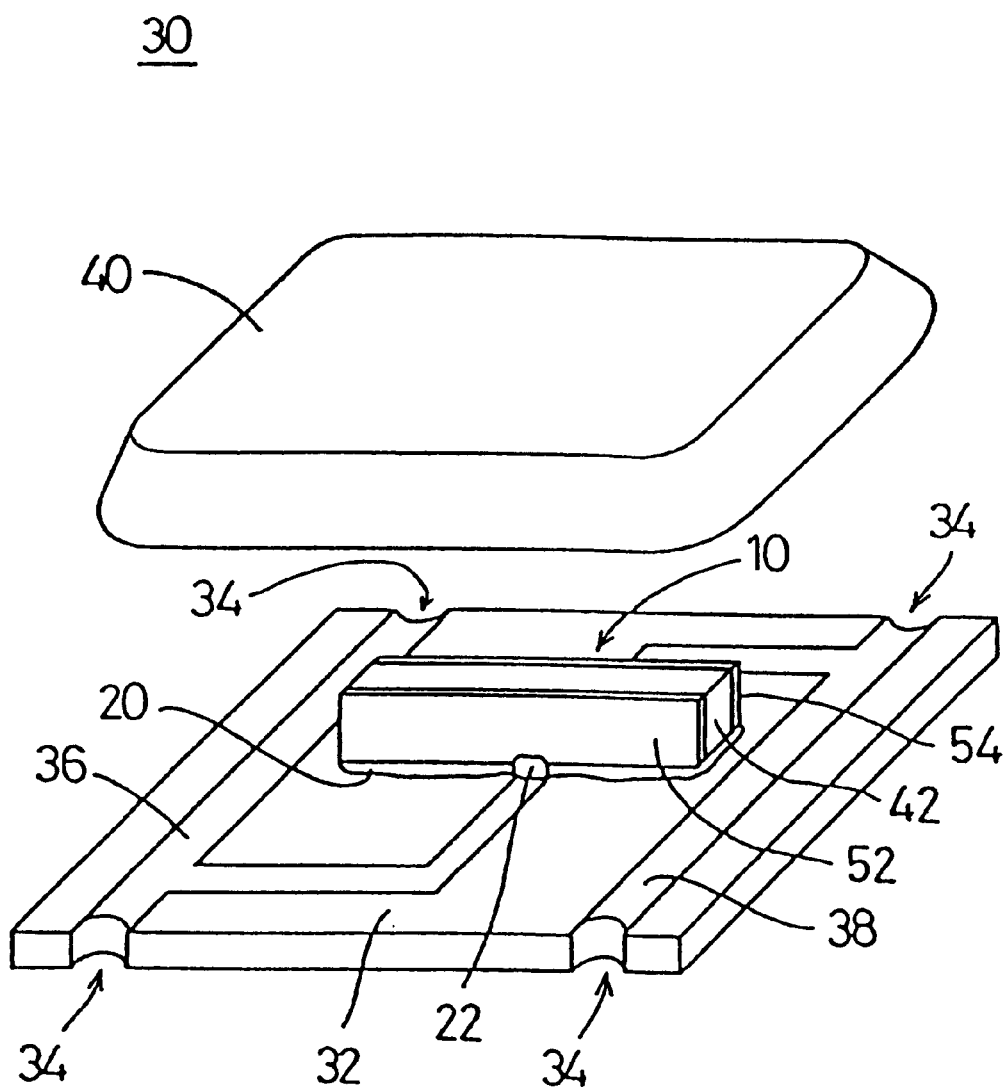
FIG. 15 is a perspective view illustrating another preferred embodiment of an electronic component using the piezoelectric resonator shown in FIG. 12.
Figure 16:
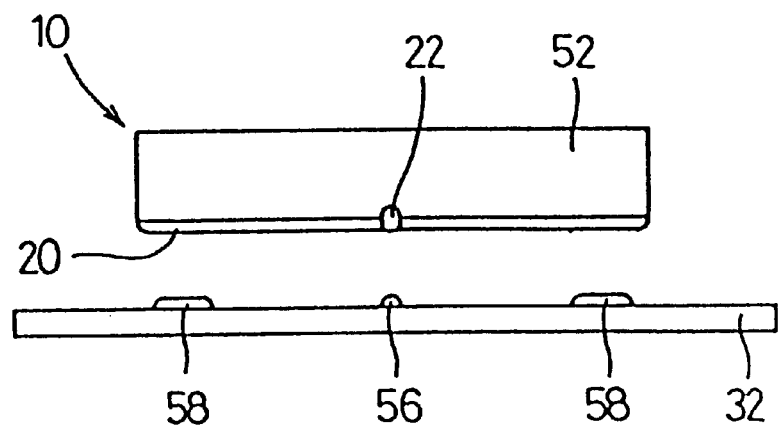
FIG. 16 is a schematic diagram illustrating the positions of adhesives used to bond the piezoelectric resonator to the substrate in the electronic component device shown in FIG. 15.
Figure 17A:
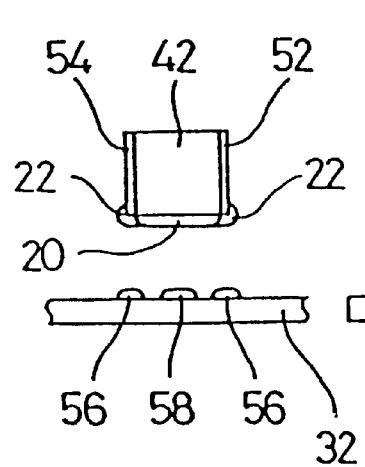
FIG. 17(a) and 17(b) are schematic diagrams illustrating another example of the positions of adhesives used to bond the piezoelectric resonator to the substrate in the electronic component device shown in FIG. 15.
Figure 17B:
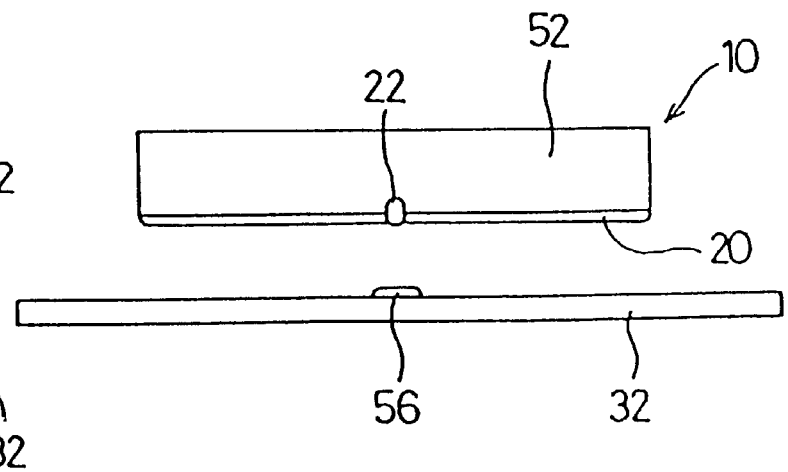

One side surface of the main body 42, on which no external electrodes 52 and 54 are located, is preferably covered with a resin material 20 and electrically conductive resin material elements 22, similar to the structure shown in FIGS. 5 and 6. The above-described piezoelectric resonator 10 is mounted on the substrate 32 as shown in FIG. 15. As shown in FIG. 16, the electrically conductive resin material elements 22 are connected via an electrically conductive adhesive 56 or the like to lead electrodes 36 and 38, respectively, provided on the substrate 32. The piezoelectric resonator 10 is bonded, at both ends thereof in the longitudinal direction, to the substrate 32 via an electrically insulating adhesive 58. Alternatively, as shown in FIGS. 17(a) and 17(b), an electrically insulating adhesive 58 may be coated on the substrate 32, in an area between the electrically conductive adhesives 56 on the lead electrodes 36 and 38, and the piezoelectric resonator 10 may be bonded to the substrate 32 via the electrically insulating adhesive 58. As a result, the lead electrodes 36 and 38 on the substrate 32 are electrically connected via the electrically conductive resin material elements 22 to the external electrodes 52 and 54 on the piezoelectric resonator element 12. Then the substrate 32 is covered with a metal cap 40, and thus an electronic component 30 is complete.

In this electronic component 30, when a signal is applied via the lead electrodes 36 and 38 and the electrically conductive resin material elements 22 shown in FIG. 15, a voltage is applied in opposite directions across the respective piezoelectric bodies 44 of the main body 42 that are polarized in opposite directions. As a result, the piezoelectric bodies 44 are expanded and contracted in the same direction as a single integral unit. As a result, the piezoelectric resonator 10 as a whole is excited so that longitudinal vibration occurs such that a vibration node is defined at the approximate central portion of the main body 42. Although in the specific example described above, piezoelectric bodies disposed on opposite sides of each internal electrode 46 are polarized in opposite directions, the polarization is not limited to such direction as long as the piezoelectric resonator 10 may be vibrated in a longitudinal vibration mode.

In this electronic component 30, the polarization of the piezoelectric bodies 44 of the piezoelectric resonator 10, the electric field developed in response to a signal, and the vibration of the piezoelectric bodies 44 all occur preferably along the same axis. That is, the piezoelectric resonator 10 is a resonator using the longitudinal piezoelectric effect. The piezoelectric resonator 10 using the longitudinal piezoelectric effect has a greater electromechanical coupling coefficient than piezoelectric resonators using the transverse piezoelectric effect in which vibration occurs in a different direction from the polarization direction. As a result, the piezoelectric resonator 10 using the longitudinal piezoelectric effect has a greater difference $\Delta F$ between the resonant frequency and the antiresonant frequency. This makes it possible to obtain a greater bandwidth.

In the piezoelectric resonator 10 having the structure described above, $\Delta F$ can be adjusted by controlling the ratio of the position of the active region 42a to that of the inactive regions 42b or by controlling the locations where the inactive regions 42b are created. Furthermore, it is possible to adjust the capacitance of the piezoelectric resonator 10 by properly selecting the number of layers of the active region 42a. This makes it possible to easily construct the electronic component 30 so as to match an impedance of an external circuit to be electrically connected to the electronic component 30.

Also in the case where the piezoelectric resonator 10 is constructed to have the multilayer construction described above, the characteristics of the piezoelectric resonator 10 are substantially determined when the resin material 20 is disposed on the resonator in advance before mounting, and thus no further significant change in resonator characteristics occurs during the subsequent process in which the piezoelectric resonator 10 is mounted on the substrate 32. Furthermore, since a soft material is used as the resin material 20, it is possible to reduce the distance between the piezoelectric resonator 10 and the substrate 32 thus preventing the vibration leakage and ripples which occur in conventional devices. Therefore, it is possible to construct the electronic component 30 to have a significantly reduced size. Furthermore, the electronic component 30 can be easily produced without having to achieve precise dimensional accuracy and without having to make any adjustment after the mounting process.

Figure 18:
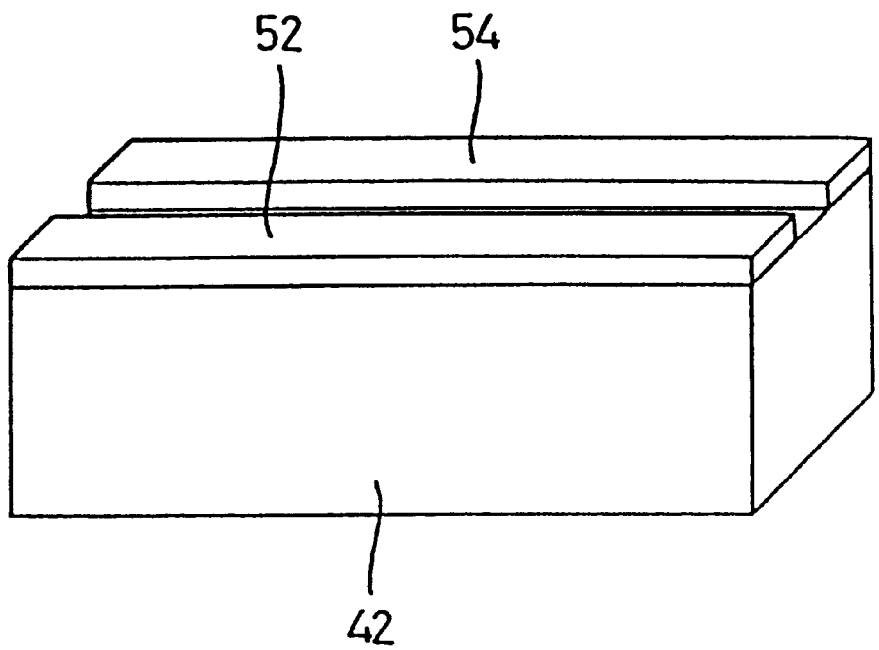
FIG. 18 is a perspective view illustrating still another example of a piezoelectric resonator element for use in the piezoelectric resonator according to preferred embodiments of the present invention.
Figure 19:
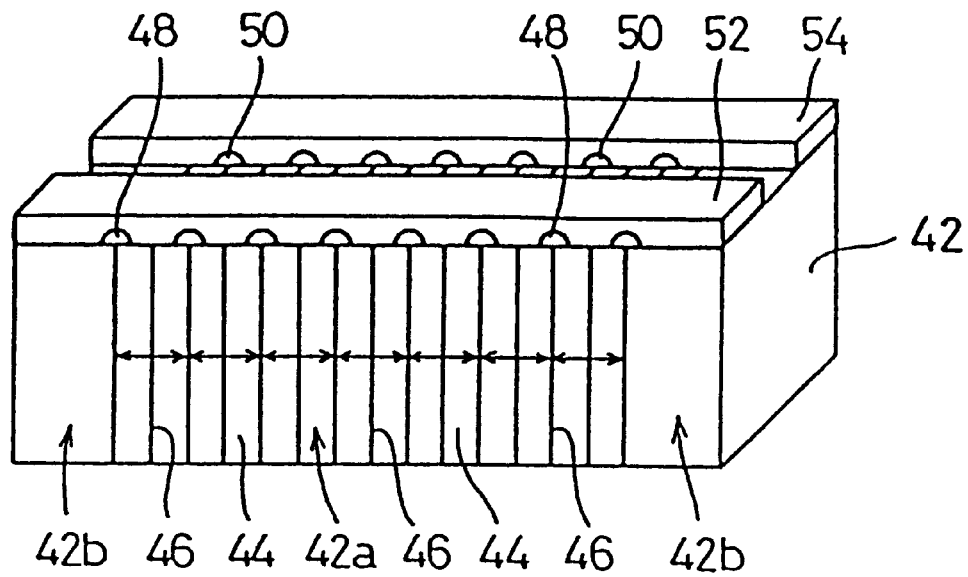
FIG. 19 is a schematic view illustrating the structure of the piezoelectric resonator element shown in FIG. 18.
Figure 20:
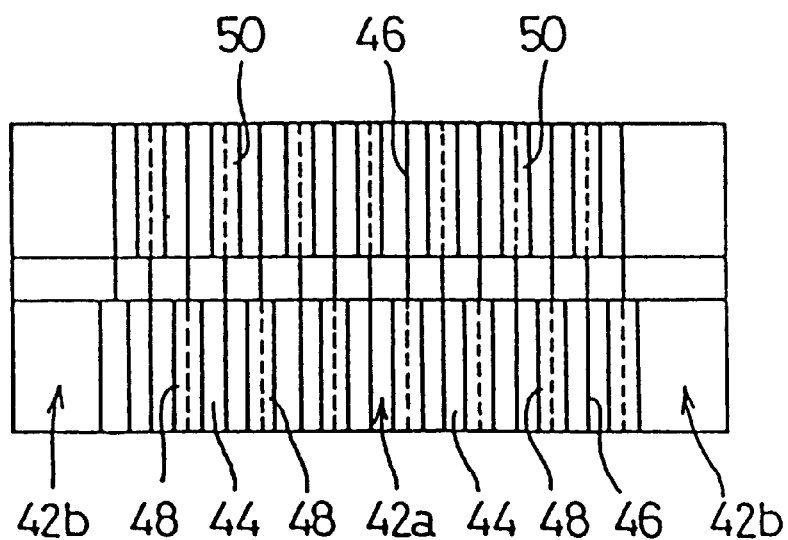
FIG. 20 is a plan view schematically illustrating the structure of the piezoelectric resonator element shown in FIG. 18.

In another preferred embodiment of the present invention, two external electrodes 52 and 54 are preferably both located on one side surface of the main body 42, as shown in FIGS. 18 and 19. In FIGS. 18 and 19, internal electrodes 46 are arranged over the entire areas of the respective layers disposed in a direction substantially perpendicular to the longitudinal direction of the main body 42. Furthermore, as shown in FIG. 20, insulating films 48 and 50 are arranged on the above-described one side surface of the main body 42 in such a manner that exposed end portions of the respective internal electrodes 46 are covered with the insulating films 48 and 50. A first group of insulating films 48 are located at one side area extending along the longitudinal direction of the main body 42 in such a manner that every two internal electrodes 46 are covered with the insulating films 48. The second group of insulating films 50 are located at the opposite side area extending along the longitudinal direction of the main body 42 in such a manner as to cover the remaining internal electrodes 46 which are not covered with the insulating film 48. Thus, the end portions of the internal electrodes 46 exposed at a first side surface of the main body 42 are alternately covered with the two insulating films 48 and 50. The insulating films 48 are disposed side by side (in parallel to each other) at the first side area extending along the longitudinal direction of the main body 42, and the insulating films 50 are disposed side by side (in parallel to each other) at the second, opposite side area extending along the longitudinal direction of the main body 42.

Two external electrodes 52 and 54 are disposed on the above-described one side surface of the main body 42 so as to be located at either side and extend along the longitudinal direction of the main body 42. The external electrode 52 is located along a straight line at the side area of the main body 42 where the insulating films 48 are located. The external electrode 54 is located along a straight line at the opposite side area of the main body 42 where the insulating films 50 are located. Thus, the external electrode 52 is connected to the internal electrodes 46, the end portion of which is not covered by the insulating films 48, and the external electrode 54 is connected to the internal electrodes 46, the end portion of which is not covered by the insulating films 50. That is, one of each pair of adjacent internal electrodes 46 is connected to one external electrode 52, and the other of each pair of adjacent internal electrodes 46 is connected to the other external electrode 54.

Figure 21:
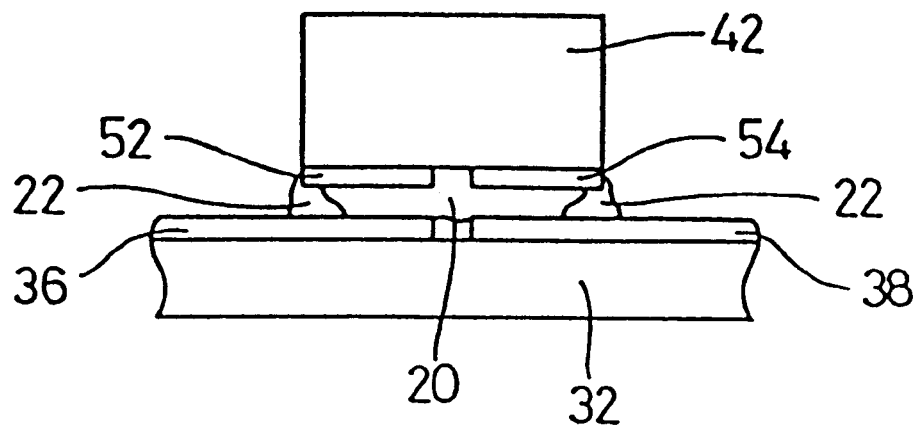
FIG. 21 is a schematic diagram illustrating the positional relationship between the piezoelectric resonator and the lead electrodes located on the substrate, in the electronic component including the piezoelectric resonator element shown in FIG. 18.

The above-described one side surface of the main body 42, on which the external electrodes 52 and 54 are disposed, is preferably coated with a resin material 20 as shown in FIG. 21. The resin material 20 is located in an area between the external electrodes 52 and 54. Furthermore, electrically conductive resin material elements 22 are preferably disposed at both ends of the width of the piezoelectric resonator element 12, at approximate central locations in the longitudinal direction of the piezoelectric resonator element 12. These electrically conductive resin material elements 22 are connected to the external electrodes 52 and 54, respectively. This piezoelectric resonator 10 is mounted on a substrate 32 in such a manner that the external electrodes 52 and 54 are electrically connected via the electrically conductive resin material elements 22 to the lead electrodes 36 and 38, respectively, provided on the substrate 32. Finally, the substrate 32 is covered with a metal cap (not shown), and thus, the electronic component 30 is complete.

Figure 22:
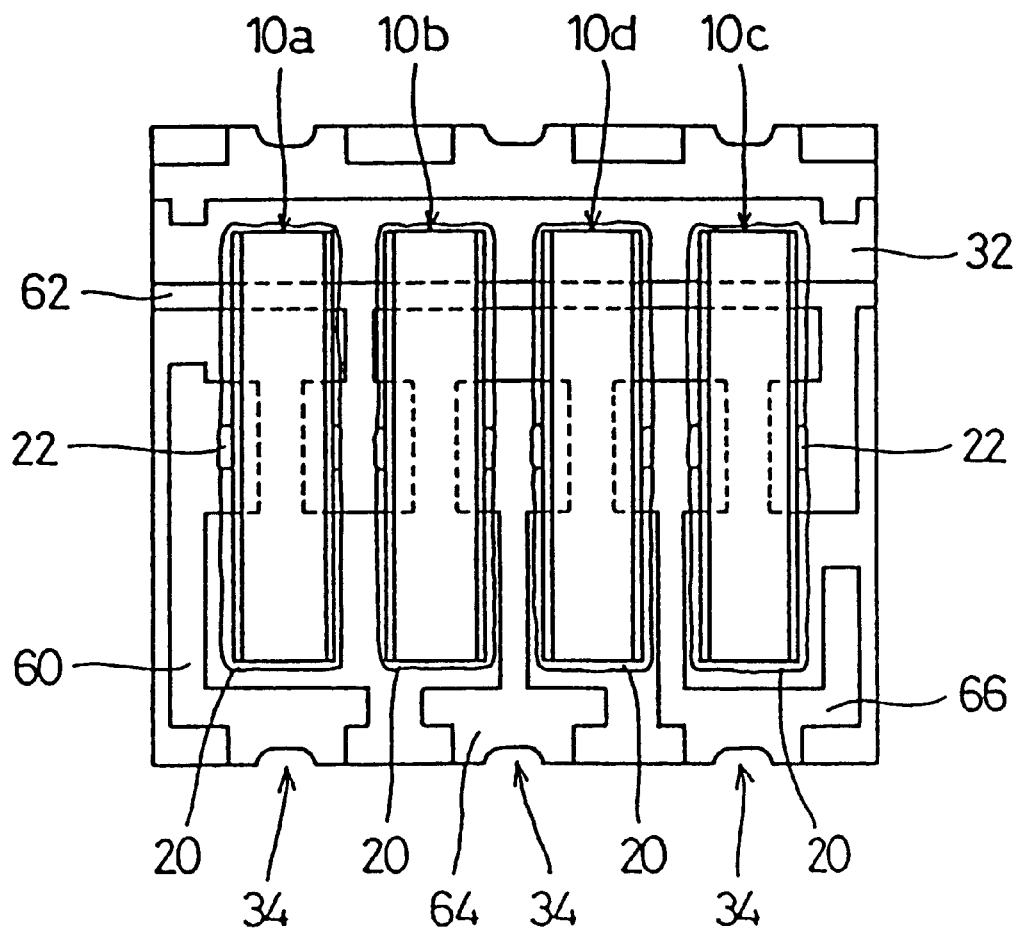
FIG. 22 is a plan view illustrating the main parts of an electronic component device constructed to define a ladder fitter using a plurality of piezoelectric resonators according to another preferred embodiment of the present invention.
Figure 23:
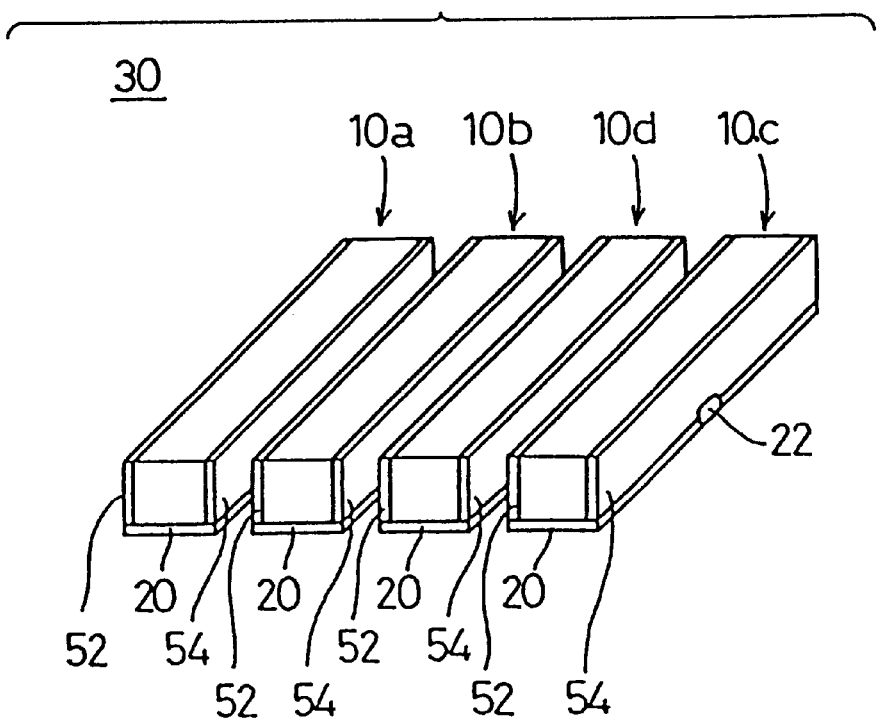
FIG. 23 is an exploded perspective view illustrating the main parts of the ladder filter shown in FIG. 22.
Figure 23:
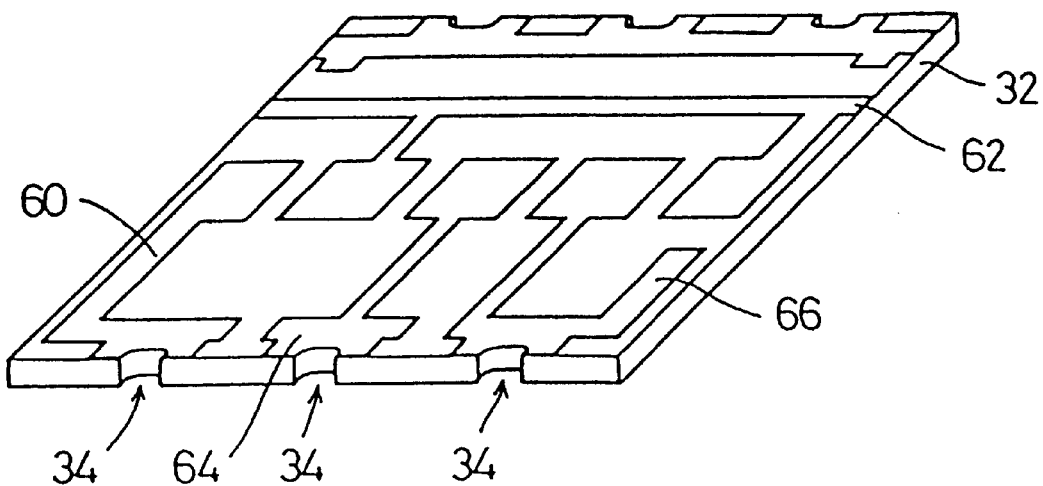

FIG. 22 is a plan view illustrating the main parts of an electronic component 30 constructed so as to define a ladder filter with a plurality of piezoelectric resonators, and FIG. 23 is a perspective view thereof. This electronic component 30 preferably includes four lead electrodes 60, 62, 64, and 66 disposed on a substrate 32. A plurality of lands are located on the substrate 32 so as to be spaced from each other and disposed along a line. The first land located on one end portion of the substrate 32 is connected to the lead electrode 60. The second and fifth lands are connected to the lead electrode 62. The third land is connected to the lead electrode 64, and the fourth land is connected to the lead electrode 66.

Figure 24:
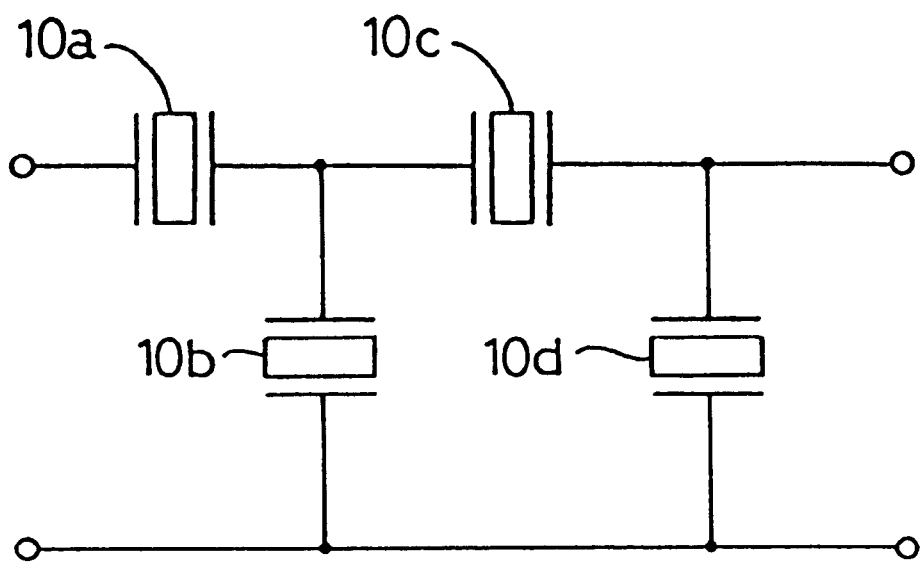
FIG. 24 is an equivalent circuit diagram of the ladder filter shown in FIG. 22.

Piezoelectric resonators 10a, 10b, 10c, and 10d having a structure similar to that shown in FIG. 12 and FIG. 13 are mounted on the substrate 32 so that the external electrodes 52 and 54 of each piezoelectric resonator are connected to corresponding two lands, thereby achieving a ladder circuit as shown in FIG. 24. As in the preferred embodiment shown in FIG. 11, the substrate 32 is covered with a metal cap (not shown).

This electronic component 30 functions as a ladder filter and has an equivalent circuit shown in FIG. 24. In this circuit, for example two piezoelectric resonators 10a and 10c function as series resonators and the other two piezoelectric resonators 10b and 10d function as parallel resonators. In this ladder filter, the parameters are designed so that the capacitance of the parallel piezoelectric resonators 10b and 10d is much greater than the capacitance of the series piezoelectric resonators 10a and 10c. A similar ladder filter may also be constructed using piezoelectric resonators each having a structure similar to that of the piezoelectric resonator 10 shown in FIGS. 18 and 19 in which external electrodes 52 and 54 are located on one side surface of the main body 42.

Also in this case where the electronic component 30 is constructed using a plurality of piezoelectric resonators 10, the presence of the resin material 20 makes it possible to easily produce the electronic component device to have a significantly reduced size and to have reliable and stable resonator characteristics.

In preferred embodiments of the present invention, as described above, the hardness of the resin material 20 is preferably within a range of from about 0 to about 50 in units defied in the JIS-A standards so that no significant change occurs in the resonator characteristics during the process in which the resin material 20 is coated on the piezoelectric resonator element 12 and then the piezoelectric resonator element is mounted on the substrate 32. The effect of the selected resin material and its prevention of any change in resonator characteristics is apparent from the results shown in FIGS. 25 and 26.

Figure 25:
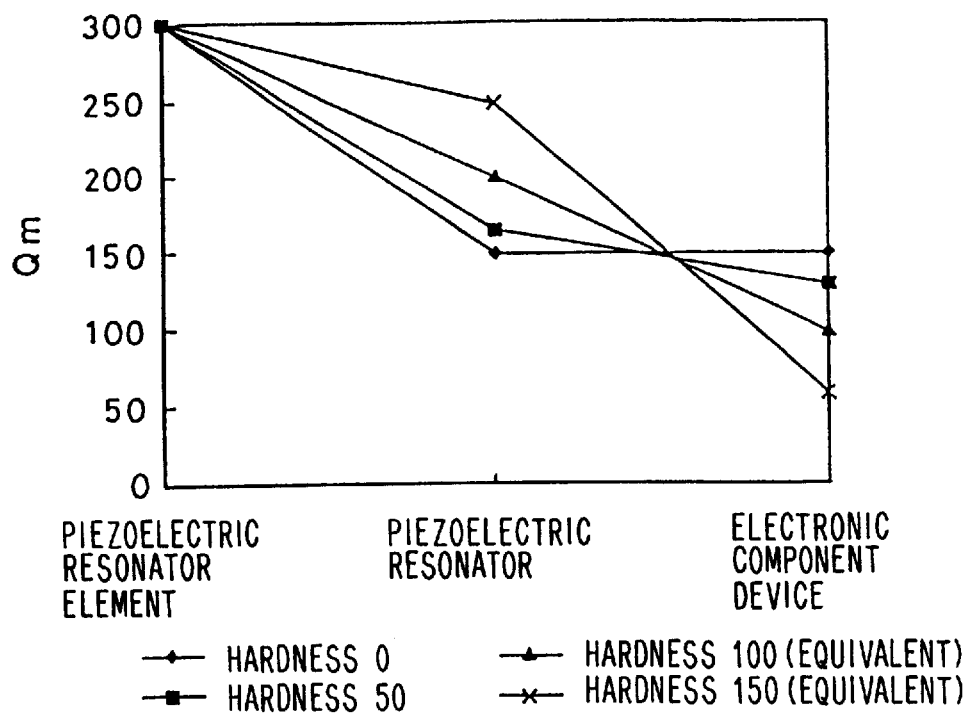
FIG. 25 is a graph illustrating Qm for a piezoelectric resonator element, a piezoelectric resonator having a resin material dispose thereon, and an electronic component device including a piezoelectric resonator element mounted on a substrate according to preferred embodiments of the present invention.
Figure 26:
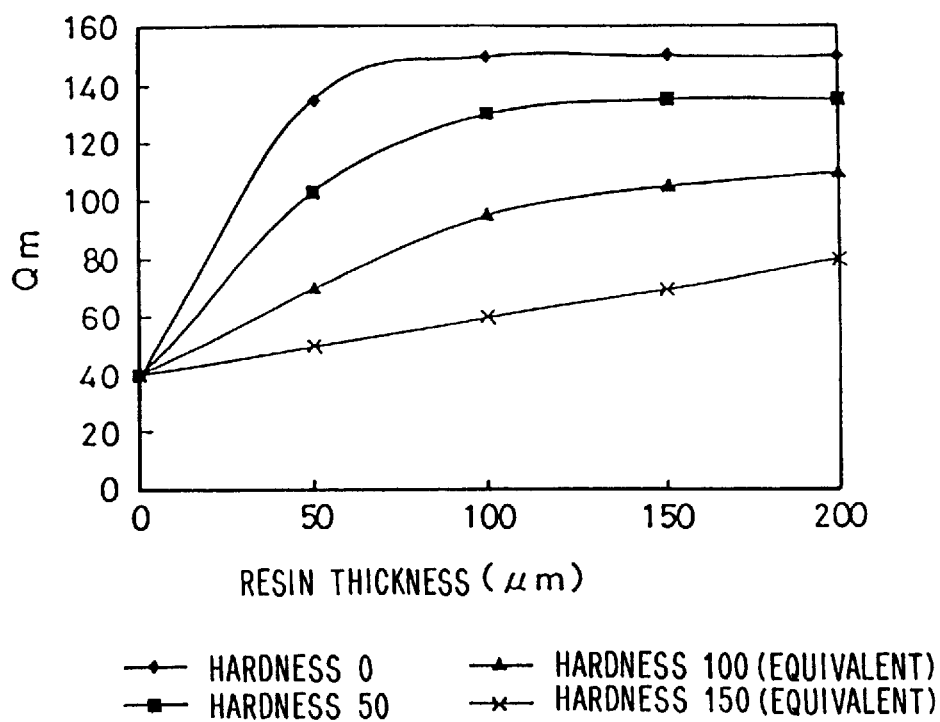
FIG. 26 is a graph illustrating Qm as a function of the thickness of the resin material of the piezoelectric resonator.

FIG. 25 illustrates the mechanical quality factor Qm for the piezoelectric resonator element 12, the piezoelectric resonator 10 having the resin material 10, and the electronic component 30 including the piezoelectric resonator 10 mounted on the substrate 32. FIG. 26 illustrates Qm as a function of the thickness of the resin material 20 of the piezoelectric resonator 10. Although the maximum value of the hardness defined in the JIS-A standards is 99, some calculated equivalent values shown in FIGS. 25 and 26 are greater than the maximum value.

As can be seen from FIG. 25, in the case where the resin material has a hardness of from about 0 to about 50, substantially no change in Qm is observed between the value obtained before and the value after mounting the piezoelectric resonator 10 on the substrate 32. In contrast, in the case where the resin material has a hardness corresponding to about 100 or about 150 in units defined in the JIS-A standards, great changes in Qm occur when the piezoelectric resonator is mounted on the substrate. From FIG. 26, it can be seen that when the thickness of the resin material 20 is varied, a small change occurs in Qm for the JIS-A hardness of about 0 or about 50 while a great change occurs in Qm for the equivalent JIS-A hardness of about 100 or about 150. In the case where the resin material has a JIS-A hardness of from about 0 to about 50, stable characteristics can be obtained in the thickness range greater than 50 μm.

As described above, if the resin material has a hardness within the range from about 0 to about 50 in units defined in the JIS-A standards, it is possible to achieve stable characteristics in the piezoelectric resonator 10, and thus no adjustment is required after mounting the piezoelectric resonator on the substrate.

Figure 27:
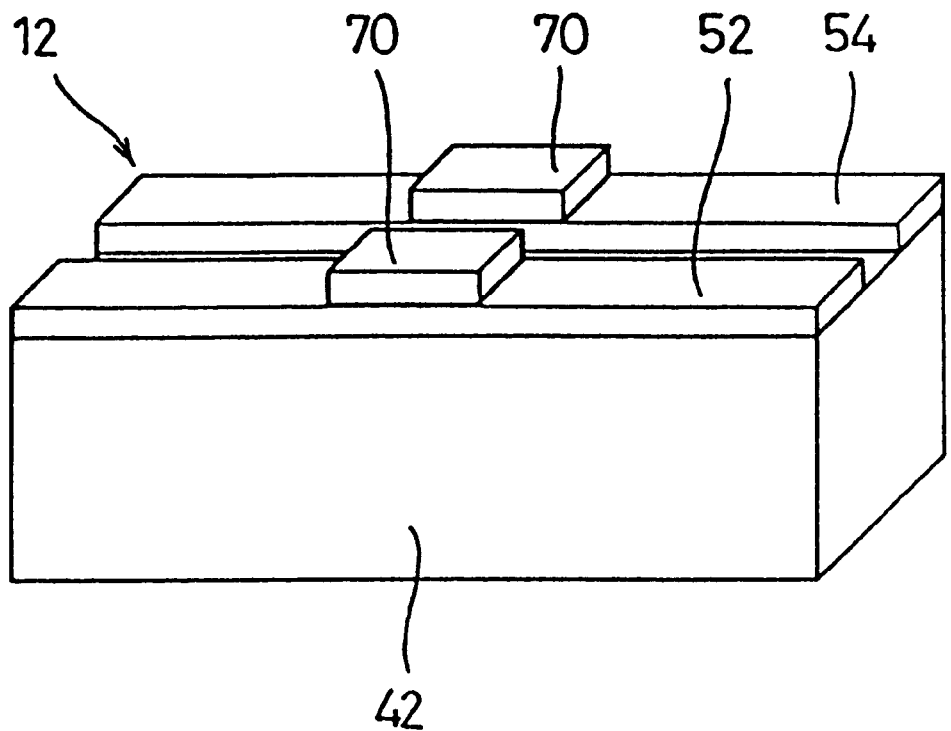
FIG. 27 is a perspective view illustrating another preferred embodiment of a piezoelectric resonator according to the present invention.

In the above preferred embodiments, the resin material is disposed on the piezoelectric resonator element for use in the piezoelectric resonator or the piezoelectric component device. Instead, as shown in FIG. 27, supporting members 70 made of an electrically conductive resin with an elastic modulus of about 0.1 to about 10 MPa may be used. In this specific example, a piezoelectric resonator element similar to that shown in FIG. 18 is used, and supporting members 70 are disposed on the external electrodes 52 and 54, respectively, at the approximate central portion in the longitudinal direction of the piezoelectric resonator element 12. The supporting members 70 are constructed to have a width that is substantially equal to the width of the external electrodes 52 and 54. Preferred examples of the electrically conductive resin include silicone resins, urethane resins, and soft epoxy resins. The supporting members 70 are bonded via an adhesive to the lead electrodes 36 and 38, respectively, of the substrate 32. As for the adhesive for this purpose, for example an electrically conductive epoxy adhesive may be used. In the piezoelectric resonator 10 constructed in the above-described manner, a signal is applied between the external electrodes 52 and 54 via the lead electrodes 36 and 38 and further via the supporting members 70.

Also in this piezoelectric resonator 10, the presence of the supporting members 70 made of the electrically conductive resin having an elastic modulus of about 0.1 to about 10 MPa prevents vibration from leaking to the substrate 32 from the piezoelectric resonator 10 thus preventing ripples from occurring. Furthermore, after forming the supporting members 70 in advance, the longitudinal vibration is not affected when the piezoelectric resonator 10 is mounted on the substrate 32. As a result, no significant changes occur in the resonator characteristics when the piezoelectric resonator 10 is mounted on the substrate 32.

Figure 28:
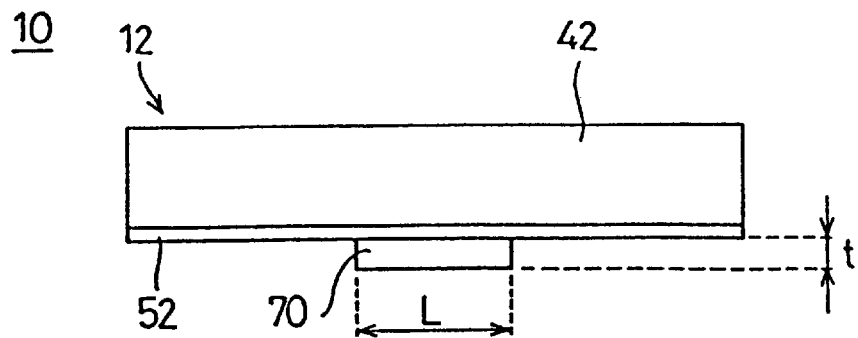
FIG. 28 is a schematic diagram illustrating examples of dimensions of supporting members located on the piezoelectric resonator shown in FIG. 27.
Figure 29:
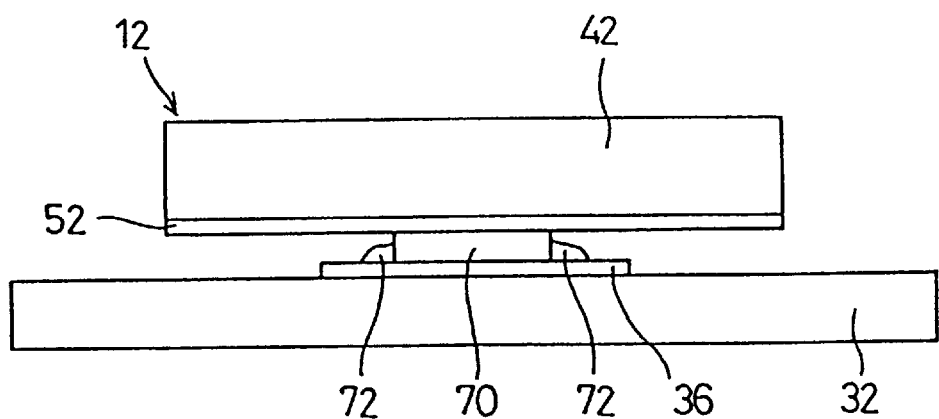
FIG. 29 is a schematic diagram illustrating the piezoelectric resonator shown in FIG. 27, wherein the piezoelectric resonator is mounted on a substrate.

In the piezoelectric resonator 10, if the elastic modulus of the supporting members 70 is controlled to be within the range from about 0.1 to about 10 MPa, then the vibration leakage is suppressed regardless of the size of the supporting members 70. That is, as shown in FIG. 28, the vibration leakage in the piezoelectric resonator 10 is suppressed regardless of the length L and the thickness t of the supporting members 70. When the piezoelectric resonator 10 is mounted on the substrate 32, the adhesive 72 can be partially deposited on the side wall of the supporting members 70, as shown in FIG. 29. In particular when a hard epoxy adhesive having a great adhesion strength is used, it is required to set the thickness t of the supporting members 70 to a value greater than the height of the part of the epoxy adhesive 72 deposited on the side wall. If the adhesive 72 comes into contact with the piezoelectric resonator element 12, vibration leakage can occur via the adhesive 72.

Figure 30:
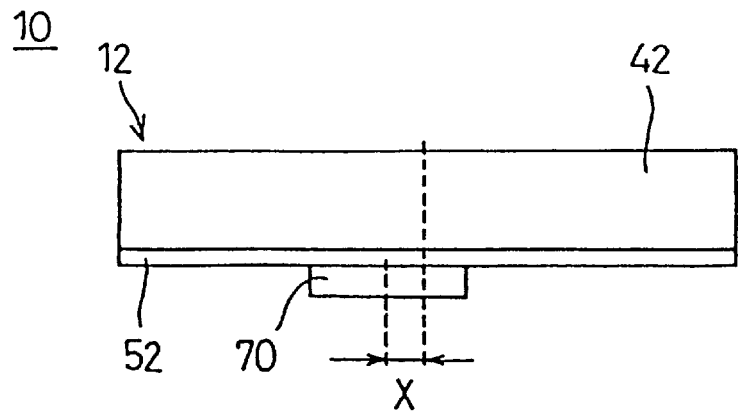
FIG. 30 is a schematic diagram illustrating the positional relationship between the piezoelectric resonator element and the supporting members in the piezoelectric resonator shown in FIG. 27.

It is not necessary that the supporting members 70 are located at the center along the length of the piezoelectric resonator element 12, but the supporting members 70 may also be disposed at locations shifted from the center, as shown in FIG. 30, without encountering a significant increase in vibration leakage. As described above, it is possible to achieve low vibration leakage from the piezoelectric resonator 10 regardless of the length L and the thickness t of the supporting members 70 and regardless of the shift X from the center of the piezoelectric resonator element 12. However, the mechanical quality factor Qm of the piezoelectric resonator 10 decreases with the increase in L, t, and X. Therefore, the dimensions of the supporting members 70 should be determined within a range in which a desired value of Qm is obtained.

In this preferred embodiment, it is also possible to use a piezoelectric resonator element 12 constructed similar to that shown in FIG. 1 in which the external electrodes 16 and 18 are disposed on two opposite side surfaces of the substantially rectangular-shaped piezoelectric body 14 which is polarized in a direction that is substantially perpendicular to the external electrodes 16 and 18. In this case, two supporting members may be located on one side surface of the piezoelectric body 14 at which end portions of both external electrodes 16 and 18 are exposed. The supporting members 70 are preferably arranged to be electrically connected to the external electrodes 16 and 18, wherein the electric connections are realized at the approximate central portion in the longitudinal direction of the piezoelectric resonator element 12 and at both ends in the width direction of the piezoelectric resonator element 12. Also in the case where the piezoelectric resonator 10 having the above-described structure is used, vibration leakage from the piezoelectric resonator element 12 is prevented by the supporting members 70. Furthermore, the supporting members 70 can be used to realize electric connections of the external electrodes 16 and 18 of the piezoelectric resonator element 12 to the lead electrodes located on the substrate. The Qm of the piezoelectric resonator 10 can be adjusted by properly selecting the dimensions of the supporting members 70.

Figure 31:
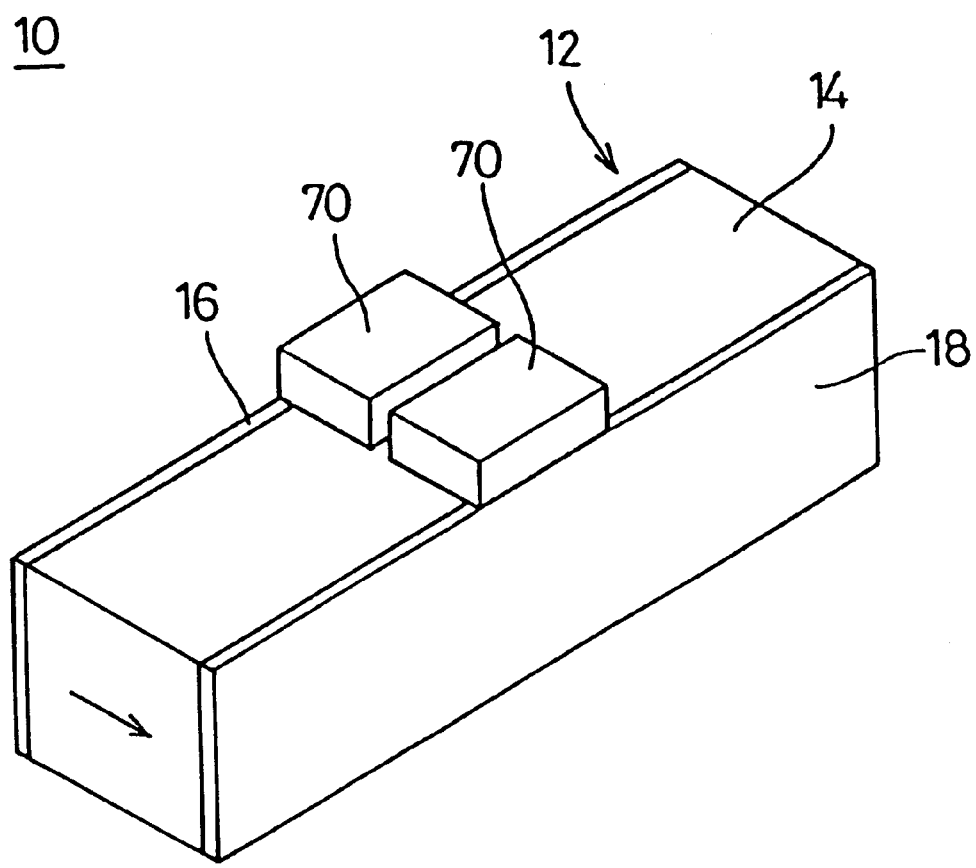
FIG. 31 is a perspective view illustrating still another preferred embodiment according to the present invention.
Figure 33:
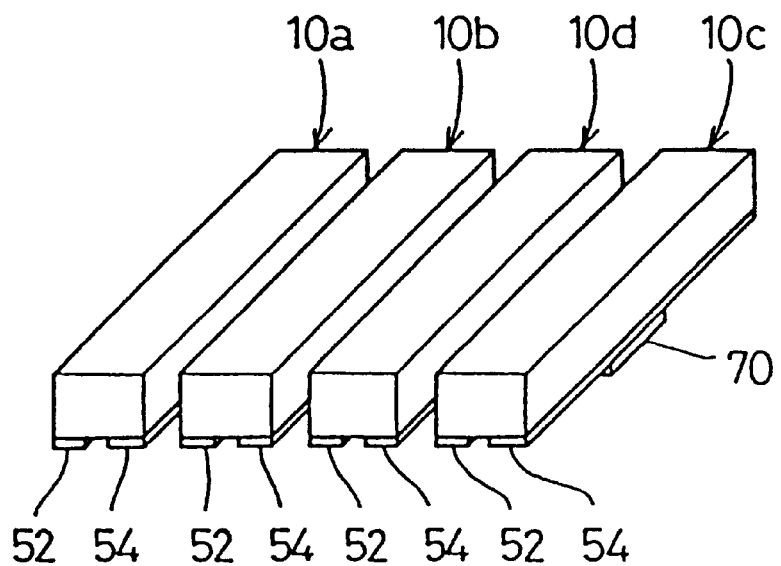
FIG. 33 is an exploded perspective view illustrating a preferred embodiment of an electronic component device constructed to define a ladder filter using piezoelectric resonators having supporting members.
Figure 33:
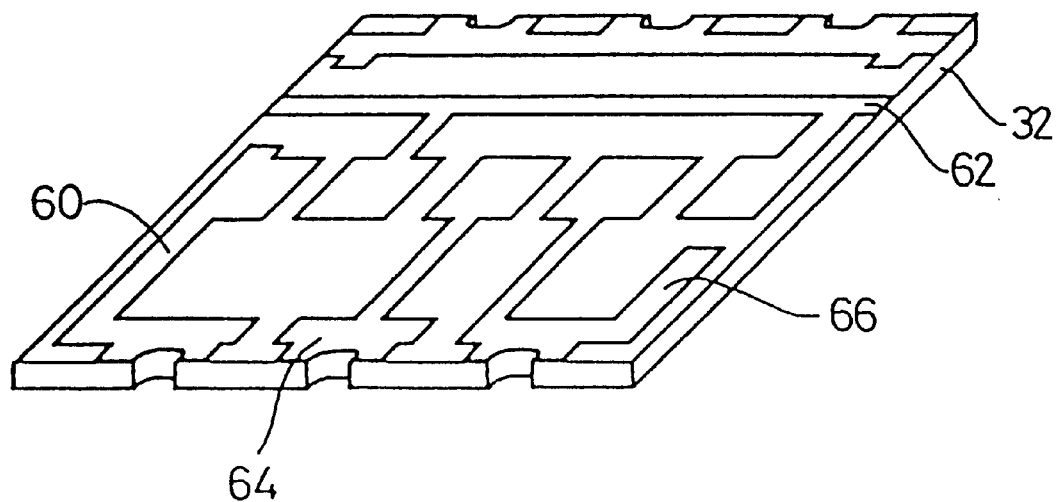
Figure 34:
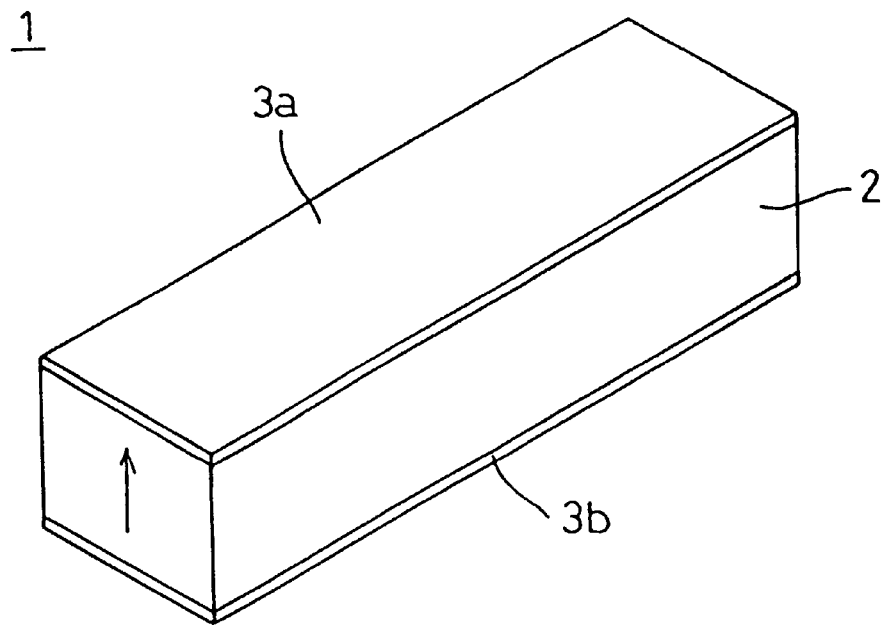
FIG. 34 is a perspective view illustrating an example of a conventional piezoelectric resonator.
Figure 35:
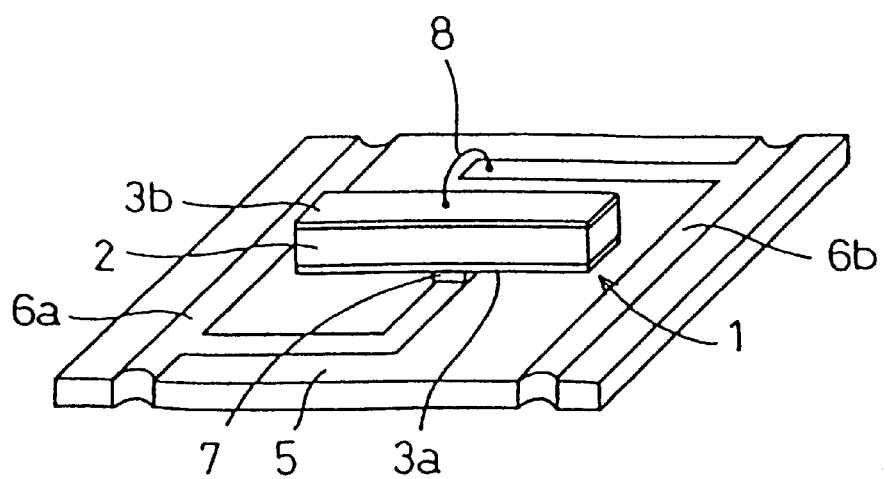
FIG. 35 is a perspective view illustrating an example of an electronic component device using the piezoelectric resonator shown in FIG. 34.

As described above, reliable resonator characteristics can be achieved in the piezoelectric resonator 10 when the supporting members are made of a resin having an elastic modulus of about 0.1 to about 10 MPa. Thus, no resonator characteristic adjustment is required after mounting the piezoelectric resonator 10 on the substrate 32 in the electronic component 30 as shown in FIG. 32. Furthermore, a ladder filter such as that shown by the equivalent circuit diagram of FIG. 24 can also be realized using the piezoelectric resonators 10 having the above-described supporting members 70 as shown in FIG. 33. In the electronic components shown in FIGS. 32 and 33, the piezoelectric resonators 10 used are not limited to the type shown in FIG. 27, but the piezoelectric resonators of the type shown in FIG. 31 may also be used.

While the invention has been described and particularly shown with reference to preferred embodiments thereof, it will be understood to those skilled in the art that the foregoing and other changes in form and details may be made therein without departing from the spirit and scope of the invention.

What is claimed is:

1. A piezoelectric resonator comprising:
   a piezoelectric resonator element vibrating in a longitudinal vibration mode and having a mounting surface; and
   a resin material provided on the mounting surface of said piezoelectric resonator element; wherein
   said resin material has an elastic modulus of about 0.1 to about 10 MPa.

2. A piezoelectric resonator comprising:
   a piezoelectric resonator element vibrating in a longitudinal vibration mode and having a mounting surface; and
   a resin material provided on the mounting surface of said piezoelectric resonator element; wherein
   said resin material has a hardness of about 0 to about 50 in units defined in the JIS-A standards.

3. The piezoelectric resonator according to claim 2, wherein said resin material has an elastic modulus of about 0.1 to about 10 MPa.

4. The piezoelectric resonator according to claim 2, wherein said piezoelectric resonator has a length, and said resin material is located at least at a substantially central portion along the length of said piezoelectric resonator element.

5. The piezoelectric resonator according to claim 2, wherein said piezoelectric resonator element includes a pair of external electrodes and a pair of electrically conductive resin materials are connected to said pair of external electrodes, respectively at the substantially central portion of said piezoelectric resonator element.

6. The piezoelectric resonator according to claim 5, wherein each of said pair of external electrodes has a substantially planar shape, said piezoelectric resonator element includes said pair of external electrodes and a piezoelectric body disposed between said external electrodes, and said piezoelectric body is polarized in a direction which is substantially perpendicular to a plane in which said external electrodes are located.

7. The piezoelectric resonator according to claim 5, wherein said piezoelectric resonator element includes a main body having a length and at least two substantially planar shaped internal electrodes arranged to be substantially perpendicular to said length and a piezoelectric body disposed between said internal electrodes, said piezoelectric body is polarized in a direction along the length of said main body, and said pair of internal electrodes are connected to said pair of external electrodes, respectively.

8. The piezoelectric resonator according to claim 5, wherein a thermal expansion coefficient of said resin material is substantially equal to a thermal expansion coefficient of said electrically conductive resin materials.

9. The piezoelectric resonator according to claim 2, wherein said piezoelectric resonator element comprises a main body having a length and a pair of external electrodes which are one of provided on the mounting surface of said main body and provided to be exposed at the mounting surface, and a pair of said resin materials which are electrically conductive, disposed on the mounting surface of said main body, and electrically connected to said pair of external electrodes, respectively.

10. The piezoelectric resonator according to claim 9, wherein said resin materials are located at the substantially central portion of said piezoelectric resonator element on the mounting surface.

11. The piezoelectric resonator according to claim 9, wherein each of said pair of external electrodes has a substantially planar shape, said piezoelectric resonator element includes said pair of external electrodes and a piezoelectric body disposed between said external electrodes, and said piezoelectric body is polarized in a direction which is substantially perpendicular to a plane in which said external electrodes are located.

12. The piezoelectric resonator according to claim 9, wherein said piezoelectric resonator element includes a main body having a length and at least two substantially planar shaped electrodes arranged to be substantially perpendicular to said length and a piezoelectric body disposed between said substantially planar shaped electrodes, said piezoelectric body is polarized in a direction along the length of said main body, and said pair of substantially planar shaped electrodes are connected to said pair of external electrodes, respectively.

13. An electronic component device including the piezoelectric resonator of claim 2, wherein said piezoelectric resonator is mounted on a substrate via said resin material.

14. An electronic component device including the piezoelectric resonator of claim 5, wherein said piezoelectric resonator is mounted on a substrate via said resin material, and said external electrodes are connected via said electrically conductive resin materials to lead electrodes provided on said substrate.

15. The electronic component device according to claim 14, wherein said electrically conductive resin materials of the piezoelectric resonator are connected to said lead electrodes via an electrically conductive adhesive.

16. The electronic component device including a piezoelectric resonator of claim 9, wherein said piezoelectric resonator is mounted on the substrate via said electrically conductive resin materials.

17. The electronic component device according to claim 16, wherein said external electrodes are electrically connected via said electrically conductive resin materials to lead electrodes provided on the substrate.

18. The electronic component device according to claim 17, wherein said electrically conductive resin materials are fixed via an electrically conductive adhesive to said lead electrodes, respectively.

19. The electronic component device according to claim 9, wherein a plurality of said piezoelectric resonators are disposed on said substrate and connected in such a manner as to form a ladder filter.

\* \* \* \* \*